(12) United States Patent
Sassano et al.

(10) Patent No.: US 10,827,643 B2
(45) Date of Patent: Nov. 3, 2020

(54) RACK HAVING A STOWABLE RETRACTABLE TERMINAL FOR VARYING THE POSITIONING OF INPUT DEVICES RELATIVE TO THE REST OF THE RACK AND/OR A USER

(71) Applicant: International Business Machines Corporation, Armonk, NY (US)

(72) Inventors: Camillo Sassano, Durham, NC (US); Kevin L. Schultz, Raleigh, NC (US); Paula Besterman, Cary, NC (US); Aaron R. Cox, Tucson, AZ (US); Eric A. Eckberg, Rochester, MN (US); Scott A. Shurson, Mantorville, MN (US); Angel E. Delgado, Vail, AZ (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/138,665

(22) Filed: Sep. 21, 2018

(65) Prior Publication Data
US 2020/0100384 A1  Mar. 26, 2020

(51) Int. Cl.
*H05K 7/18* (2006.01)
*H05K 7/16* (2006.01)
*H05K 7/14* (2006.01)

(52) U.S. Cl.
CPC ........... *H05K 7/183* (2013.01); *H05K 7/1401* (2013.01); *H05K 7/1487* (2013.01); *H05K 7/1489* (2013.01); *H05K 7/16* (2013.01)

(58) Field of Classification Search
USPC .................................. 361/829, 727, 756, 728
See application file for complete search history.

(56) References Cited

U.S. PATENT DOCUMENTS 5,833,337 A   11/1998   Kofstad
6,061,966 A    5/2000   Nelson et al.
(Continued)

FOREIGN PATENT DOCUMENTS

CN   105581530 A   5/2016
JP   2006223364 A   8/2006

OTHER PUBLICATIONS

Gibson et al., "Rack Mountable Service Access Drawer," IP.com, IBM, Feb. 1, 1991, 1 page.
(Continued)

*Primary Examiner* — Hung S. Bui
(74) *Attorney, Agent, or Firm* — Zilka-Kotab, P.C.

(57) ABSTRACT

A server rack according to one embodiment includes a sidewall defining an interior, an aperture in the sidewall, and a retractable terminal horizontally positionable between a retracted position and an extended position. The retractable terminal is positioned in the interior when in the retracted position. The retractable terminal is configured to extend through the aperture of the sidewall. The retractable terminal includes a base frame and a pivoting frame pivotally coupled to the base frame. The pivoting frame is configured to receive at least a display. The pivoting frame is positionable between an undeployed position and a deployed position relative to the base frame when the retractable terminal is in the extended position. The pivoting frame is about parallel to the base frame when in the undeployed position. The pivoting frame is oriented at least 30 degrees from the base frame when in the deployed position.

19 Claims, 23 Drawing Sheets

(56) References Cited

U.S. PATENT DOCUMENTS

| | | |
|---|---|---|
| 6,305,556 B1 | 10/2001 | Mayer |
| 6,483,695 B1 | 11/2002 | Hartstein |
| 6,621,692 B1 | 9/2003 | Johnson et al. |
| 6,666,340 B2 | 12/2003 | Basinger et al. |
| 6,961,246 B2 | 11/2005 | Dickey et al. |
| 7,016,191 B2 | 3/2006 | Miyamoto et al. |
| 7,256,986 B2 | 8/2007 | Williams et al. |
| 7,527,155 B2 | 5/2009 | McClain et al. |
| 7,591,383 B1 | 9/2009 | Milton |
| 7,594,628 B2 | 9/2009 | Yang et al. |
| 7,808,795 B2 | 10/2010 | Lu |
| 7,894,194 B2 | 2/2011 | Shih et al. |
| 8,018,716 B2 | 9/2011 | McCoy |
| 8,867,214 B2 | 10/2014 | Ross et al. |
| 9,180,805 B2 | 11/2015 | Millan |
| 9,442,513 B2 | 9/2016 | Ecker et al. |
| 9,655,275 B2 | 5/2017 | Adams et al. |
| 9,861,004 B2 | 1/2018 | Anderson et al. |
| 2005/0173357 A1 | 8/2005 | McClain et al. |
| 2006/0056148 A1 | 3/2006 | Miyamoto et al. |
| 2006/0125358 A1 | 6/2006 | Williamson |
| 2007/0210686 A1 | 9/2007 | Adducci et al. |
| 2008/0123284 A1 | 5/2008 | Jaramillo et al. |
| 2009/0101603 A1 | 4/2009 | Hilburn et al. |
| 2010/0328872 A1 | 12/2010 | Chou et al. |
| 2013/0120922 A1* | 5/2013 | Castle .................. G06F 1/1601 361/679.08 |
| 2014/0027392 A1 | 1/2014 | Crippen et al. |
| 2017/0164506 A1 | 6/2017 | Anderson et al. |
| 2018/0070470 A1 | 3/2018 | Anderson et al. |

OTHER PUBLICATIONS

Anderson et al., U.S. Appl. No. 14/958,710, filed Dec. 3, 2015.
Non-Final Office Action from U.S. Appl. No. 14/958,710, dated Apr. 1, 2016.
Final Office Action from U.S. Appl. No. 14/958,710, dated Aug. 4, 2016.
Advisory Action from U.S. Appl. No. 14/958,710, dated Nov. 15, 2016.
Non-Final Office Action from U.S. Appl. No. 14/958,710, dated Jan. 6, 2017.
Notice of Allowance from U.S. Appl. No. 14/958,710, dated Aug. 15, 2017.
Anderson et al., U.S. Appl. No. 15/802,327, filed Nov. 2, 2017.
Non-Final Office Action from U.S. Appl. No. 15/802,327, dated Jun. 14, 2018.

* cited by examiner

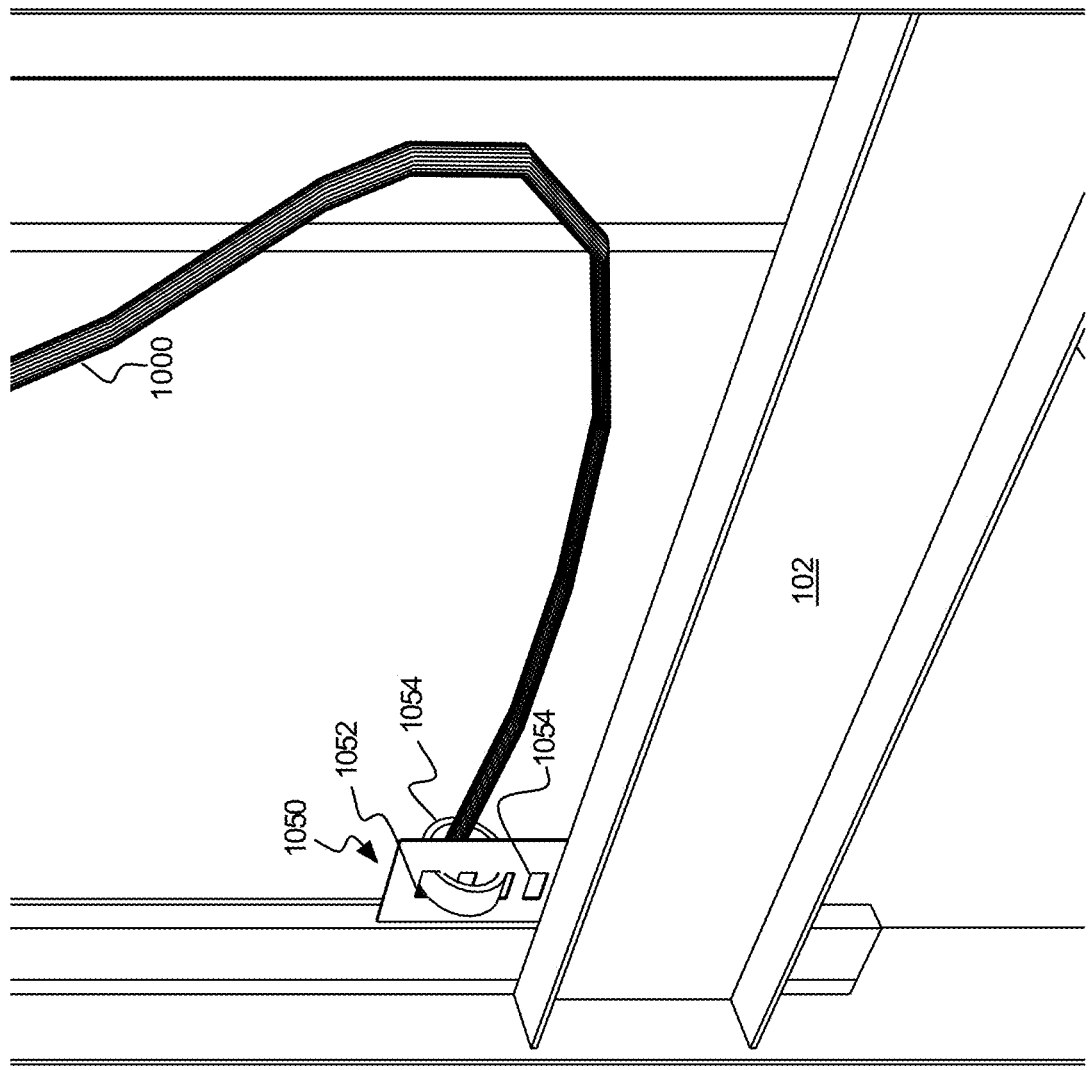

US 10,827,643 B2

RACK HAVING A STOWABLE RETRACTABLE TERMINAL FOR VARYING THE POSITIONING OF INPUT DEVICES RELATIVE TO THE REST OF THE RACK AND/OR A USER

BACKGROUND

The present invention relates to computer hardware, and more particularly, this invention relates to rack systems.

Server racks or cabinets are a common fixture in modern data centers, Internet Service Provider (ISP) facilities, and corporate server rooms. The traditional server rack is a frame or enclosure of standardized dimensions to allow the customization via modular components. Such racks allow for dense and highly-customizable data-processing hardware configurations without occupying excessive floor space.

Performing the administration or maintenance of hardware in a server rack often requires a user input device, such as a keyboard and/or mouse, and a display. Floor space is often limited in server rooms, so any space within the racks is considered valuable and is also limited. Accordingly, the installation of input devices and displays within a rack may undesirably reduce the available rack space for data-processing hardware. Further, the installation of input devices and displays within a door of the rack may block airflow and impede cooling of the electronics in the rack.

SUMMARY

A server rack according to one embodiment includes a sidewall defining an interior, an aperture in the sidewall, and a retractable terminal horizontally positionable between a retracted position and an extended position. The retractable terminal is positioned in the interior when in the retracted position. The retractable terminal is configured to extend through the aperture of the sidewall when transitioning from the retracted position to the extended position. The retractable terminal includes a base frame and a pivoting frame pivotally coupled to the base frame. The pivoting frame is configured to receive at least a display. The pivoting frame is positionable between an undeployed position and a deployed position relative to the base frame when the retractable terminal is in the extended position. The pivoting frame is about parallel to the base frame when in the undeployed position. The pivoting frame is oriented at least 30 degrees from the base frame when in the deployed position.

A server rack according to another embodiment includes a sidewall defining an interior, an aperture in the sidewall, and a retractable terminal horizontally positionable between a retracted position and an extended position. The retractable terminal is positioned in the interior when in the retracted position. The retractable terminal is configured to extend through the aperture of the sidewall when transitioning from the retracted position to the extended position. The retractable terminal is vertically positionable between upper and lower extents when in the extended position.

Other aspects and embodiments of the present invention will become apparent from the following detailed description, which, when taken in conjunction with the drawings, illustrate by way of example the principles of the invention.

BRIEF DESCRIPTION OF THE DRAWINGS

FIG. 10F is a partial perspective view of a portion of an interior defined by a sidewall of the server rack of FIGS. 10A-10E.

DETAILED DESCRIPTION

Figure 1:
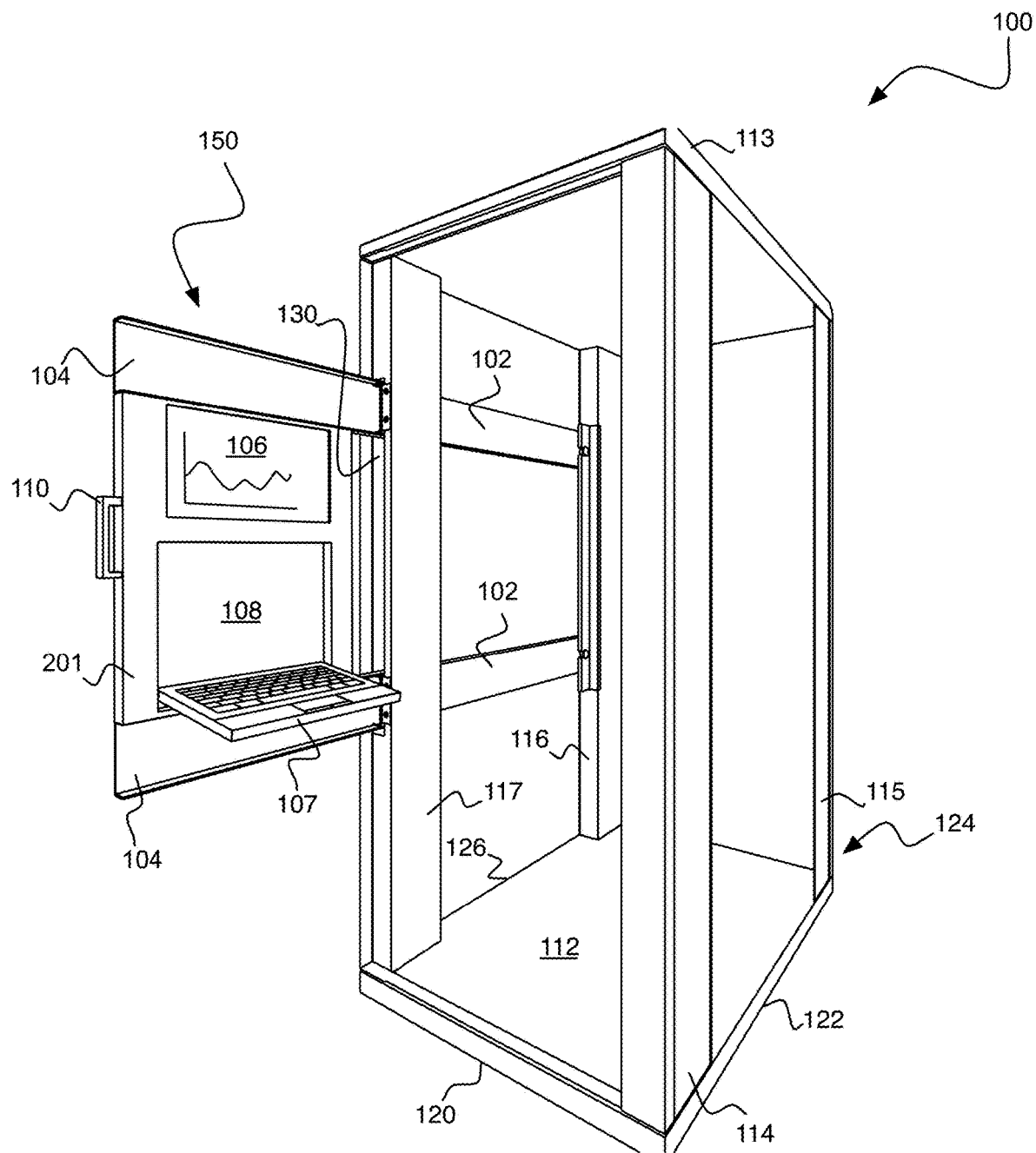
FIGS. 1-6 are several views of server racks, according to various embodiments.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of server rack systems having a retractable terminal that is adjustable in accordance with the height of a user, without restricting airflow throughout the server rack, as well as operation and/or component parts thereof.

In one general embodiment, a server rack includes a sidewall defining an interior, an aperture in the sidewall, and a retractable terminal horizontally positionable between a retracted position and an extended position. The retractable terminal is positioned in the interior when in the retracted position. The retractable terminal is configured to extend through the aperture of the sidewall when transitioning from the retracted position to the extended position. The retractable terminal includes a base frame and a pivoting frame pivotally coupled to the base frame. The pivoting frame is configured to receive at least a display. The pivoting frame is positionable between an undeployed position and a deployed position relative to the base frame when the retractable terminal is in the extended position. The pivoting frame is about parallel to the base frame when in the undeployed position. The pivoting frame is oriented at least 30 degrees from the base frame when in the deployed position.

In another general embodiment, a server rack includes a sidewall defining an interior, an aperture in the sidewall, and a retractable terminal horizontally positionable between a retracted position and an extended position. The retractable terminal is positioned in the interior when in the retracted position. The retractable terminal is configured to extend through the aperture of the sidewall when transitioning from the retracted position to the extended position. The retractable terminal is vertically positionable between upper and lower extents when in the extended position.

In data centers, system administrators and/or system service providers often utilize electronic devices for connecting directly to hardware in a rack of the data center. For example, such system administrators and/or system service providers often use a crash-cart (a portable cart having a display and monitor that can be rolled into position and connected to the proper ports on a server rack). Alternatively, the system administrators and/or system service providers use conventional integrated keyboard/display trays for utilizing/servicing a server rack that contains a respective integrated keyboard/display tray. Conventional integrated keyboard/display trays that are mounted in the interior of such racks spatially consume between 1 U-3 Us, or more, of rack space (each 1.75 inch unit of a rack is a standard unit of measure in information technology (IT) datacenters may otherwise be referred to as a U or 1 U elsewhere herein). This may be considered wasted space, because the rack space consumed by the conventional integrated keyboard/display tray cannot be used for other, higher priority systems, e.g., networking, storage, servers, etc.

Conventional integrated keyboard/display trays moreover are usually bolted in an interior of a server bay and typically are extend/retracted from the interior of the rack as a drawer, e.g., thereby allowing the display to be rotated up similar to a laptop, where the keyboard remains in a horizontal state for use. This means that the integrated keyboard/display tray is mounted in a mid-section of the rack interior, to be usable by tall and short users alike. However, users often have very different physical heights, and thus mounting the integrated keyboard/display tray in a mid-section of the rack height excludes some users from utilizing devices of the integrated keyboard/display tray. Moreover, such integrated keyboard/display trays block access to other systems within such racks. For example, displays of integrated keyboard/display trays often are positioned in front of systems of the rack positioned above the tray, which thereby, e.g., blocks viewing of such systems, prevents such systems from being serviced when the display of the integrated keyboard/display tray is folded up (unless the display is folded back down and the tray pushed back into the rack), crowds the rack, etc. It may also be noted that as a result of a display of a conventional integrated keyboard/display tray being flipped up, airflow throughout the rack is blocked. This is problematic because many systems that are often housed in server racks require cool datacenter air to be sucked into the front of the systems through perforations, pulled through the systems by fan(s) to cool the internal components, and then routed through venting in the rear of the systems. If such airflow is blocked for an extended time, one or more systems may overheat, and as a result become damaged.

Various approaches and/or embodiments described herein include a server rack having a retractable terminal configured to allow full access to systems within a server rack while maintaining a relatively low spatial profile on an exterior of the server rack when the retractable terminal is extended therefrom. Moreover, regardless of the positioning of such retractable terminal, airflow is not restricted throughout the server rack.

FIGS. 1-6 depict a server rack 100, in accordance with various embodiments. As an option, the server rack 100 may be implemented in conjunction with features from any other embodiment listed herein, such as those described with reference to the other FIGS. Of course, however, such server rack 100 and others presented herein may be used in various applications and/or in permutations which may or may not be specifically described in the illustrative embodiments listed herein. Further, the server rack 100 presented herein may be used in any desired environment.

As shown in FIG. 1, the server rack 100 includes a base 112, a top 113, sidewall 114, sidewall 115, sidewall 116, and sidewall 117. The server rack 100 is shown oriented to include a front face 120, a rear face 124, a right side 122, and a left side 126 (from a direction facing the server rack 100). As an option, a door (not shown) may be installed on the front face 120 of the server rack 100. Moreover, hardware components may be installed into, and removed from, the server rack 100 via access from the front face 120.

To assist with understanding the various embodiments disclosed herein, by providing sufficient view of the inside of the server rack 100, the sidewalls 114-117 are illustrated to be four discrete physical structures separating the base 112 from the top 113. However, it is understood that the sidewalls 114 and 115 may comprise a single panel, or one or more connected panels. Similarly, the sidewalls 116 and 117 may comprise a single panel, or one or more connected panels.

In the various embodiments disclosed herein, the server rack 100, and/or other server racks described elsewhere herein, may be of any suitable dimensions. As an option, the server rack 100 may meet Electronic Industries Alliance (EIA) standard server rack dimensions. For example, the server rack 100 may comprise a 19-inch wide rack enclosure. In accordance with EIA standardized server rack dimensions, rack mount rails (not shown) inside of the server rack 100 may be spaced 17.75 inches (450.85 mm) apart, with a height of 1.75 inches (44.45 mm). Each 1.75 inch unit may otherwise be referred to as a U or 1 U. Accordingly, the server rack 100 may be 21 U tall, 42 U tall, 44 U tall, 47 U tall, etc. On rack mount rails within the server rack 100, various computer and network hardware may be mounted. For example, the server rack 100 may house servers, switches, encryption hardware, network storage appliances, multiplexers, routers, power supplies, surge protectors, etc.

Still yet, the server rack 100 is shown to include an aperture 130 in the sidewall 117, and a retractable terminal 150 configured to extend and retract through the aperture 130 of the sidewall 117. The aperture 130 may comprise a vertically oriented space or void (i.e., height>width) that is proximal to and generally parallel with a sidewall of the server rack 100. As an option, the aperture 130 may comprise a vertically oriented space or void in a load-bearing structure of the server rack 100.

In various embodiments, the retractable terminal 150 may include a display 106 and input device 107. The display 106 may comprise a liquid crystal display (LCD), a light-emitting diode (LED) display, etc. Additionally, the input device 107 may include any combination of a mouse, a keyboard, a trackpad, touchpad, etc.

In one embodiment, the display 106 and the input device 107 may comprise a touchscreen device. FIG. 2B illustrates one embodiment wherein a touch screen device 220, such as, for example, a capacitive touch screen display or a tablet computer, is included in a panel 201 of the retractable terminal 150 in lieu of a display 106 and an input device 107.

Referring back to FIG. 1, the retractable terminal 150 includes sliding rails 104 and a handle 110. The sliding rails 104 may be configured to slide along fixed rails 102. In one embodiment, each pairing of a fixed rail 102 and sliding rail 104 may comprise a drawer slide assembly. As shown in FIG. 1, the fixed rails 102 may be attached to the sidewalls 116 and 117. In particular, the fixed rails 102 are shown attached at the sidewall 117 proximal to the front face 120 and at the sidewall 116 proximal to the rear face 124. In this manner, the retractable terminal 150 may provide display and input devices on a generally vertically oriented sliding drawer that does not utilize any space or rack units within the server rack 100. The retractable terminal 150 extends out of the server rack 100 and retracts into the server rack 100 through the aperture 130 along the fixed rails 102.

Although FIG. 1 and the following illustrations depict the server rack 100 as including two sets of sliding rails 104 and fixed rails 102, it is contemplated that only one set of sliding rails 104 and fixed rails 102 may provide adequate support and rigidity for reliably extending and retracting the retractable terminal 150.

Figure 2A:
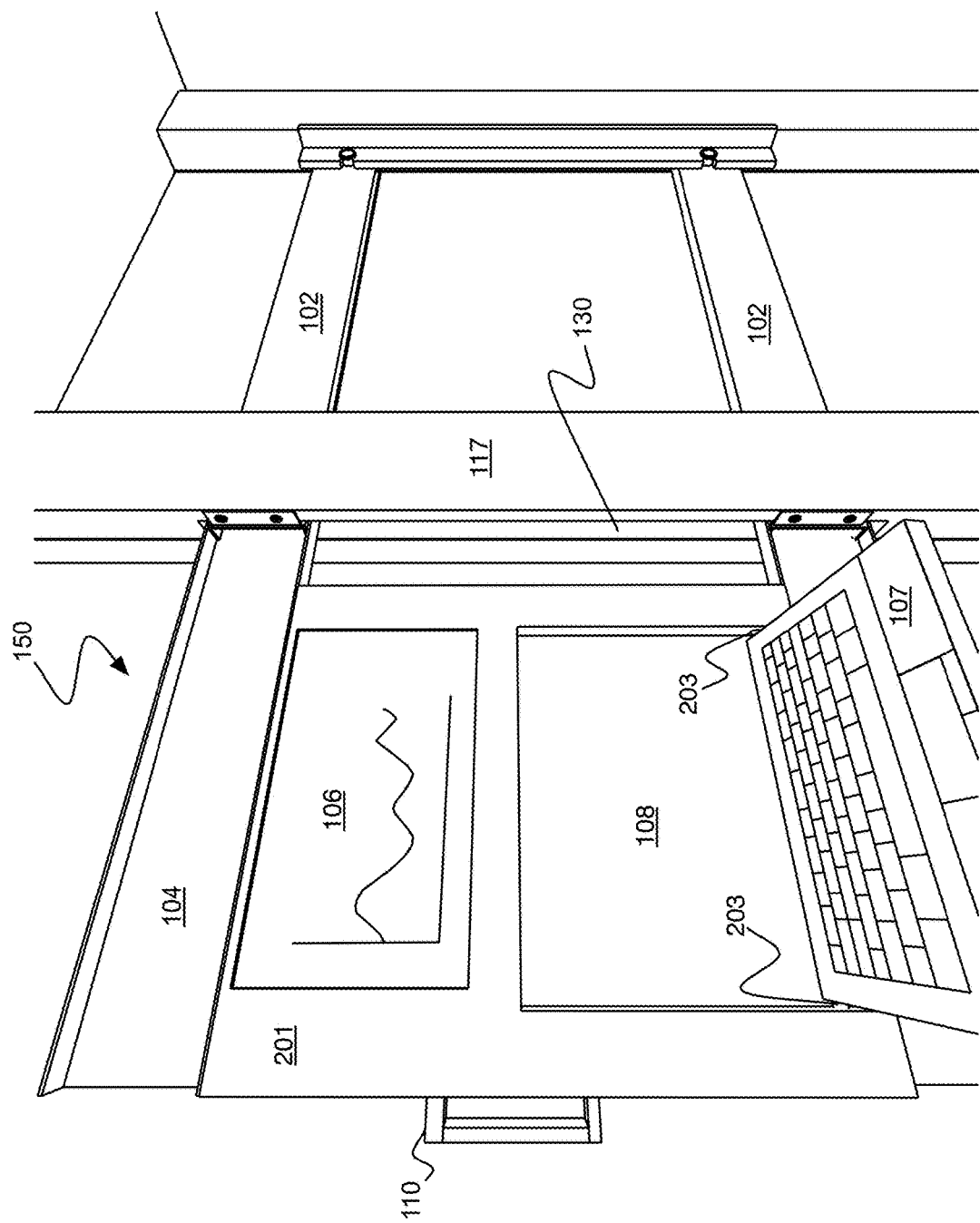
Figure 2B:
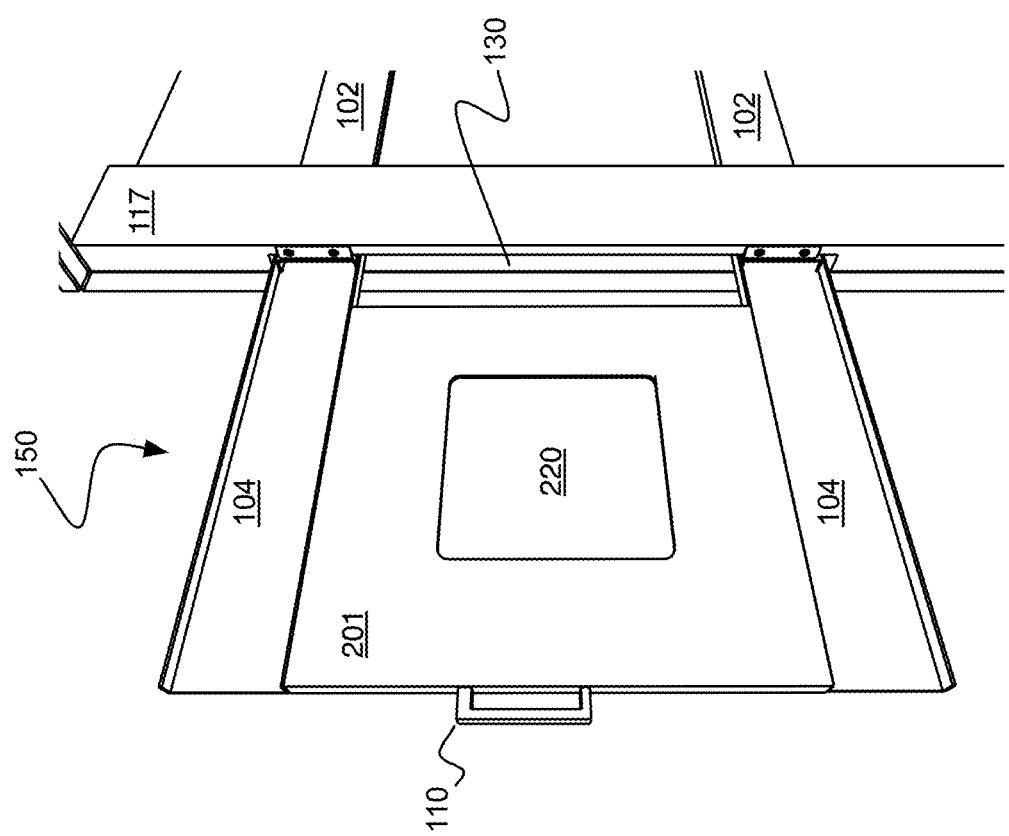

Referring now to FIG. 2A, a close-up perspective view of the retractable terminal 150 is shown. As illustrated by FIG. 2A, the display 106 and input device 107 are mounted to a panel 201. Further, the panel 201 is secured to the sliding rails 104 such that the display 106 and the input device 107 travel with the panel 201 as it is extended out of, and retracted into, the server rack 100 through aperture 130.

Moreover, the panel 201 is shown to include a recess 108. The recess 108 may include any void or indentation in the panel 201 that encloses the input device 107 when the input device 107 is not being used. The input device 107 may be pivotally mounted. For example, as shown in FIG. 2A, the input device 107 is pivotally mounted via hinges 203 in a manner that allows the input device 107 to be folded out for use in a generally horizontal orientation (as shown in FIG. 2A) when the retractable terminal 150 is extended out of the sidewall 117 for operation by a user.

In some embodiments, computing hardware may be included in the panel 201 of the retractable terminal 150. For example, included within the panel 201 may be a hardware processor and logic integrated with and/or executable by the processor. The logic may include software. For example, the software may be stored on a hard disk drive, solid state drive, memory, etc. that is installed within the panel 201. In such embodiments, the computing hardware in the panel 201 may be configured to receive input from the display 106, the input device 107, and/or the touch screen device 220, and to output display data and other data to the display 106, the input device 107, and/or the touch screen device 220.

In other embodiments, the display 106, the input device 107, and/or touch screen device 220 may send/receive Input/Output (I/O) from computing hardware installed within the server rack 100. For example, the display 106, the input device 107, and/or touch screen device 220 may be interfaced to control a rack-mounted server or workstation within the server rack 100.

Figure 3:
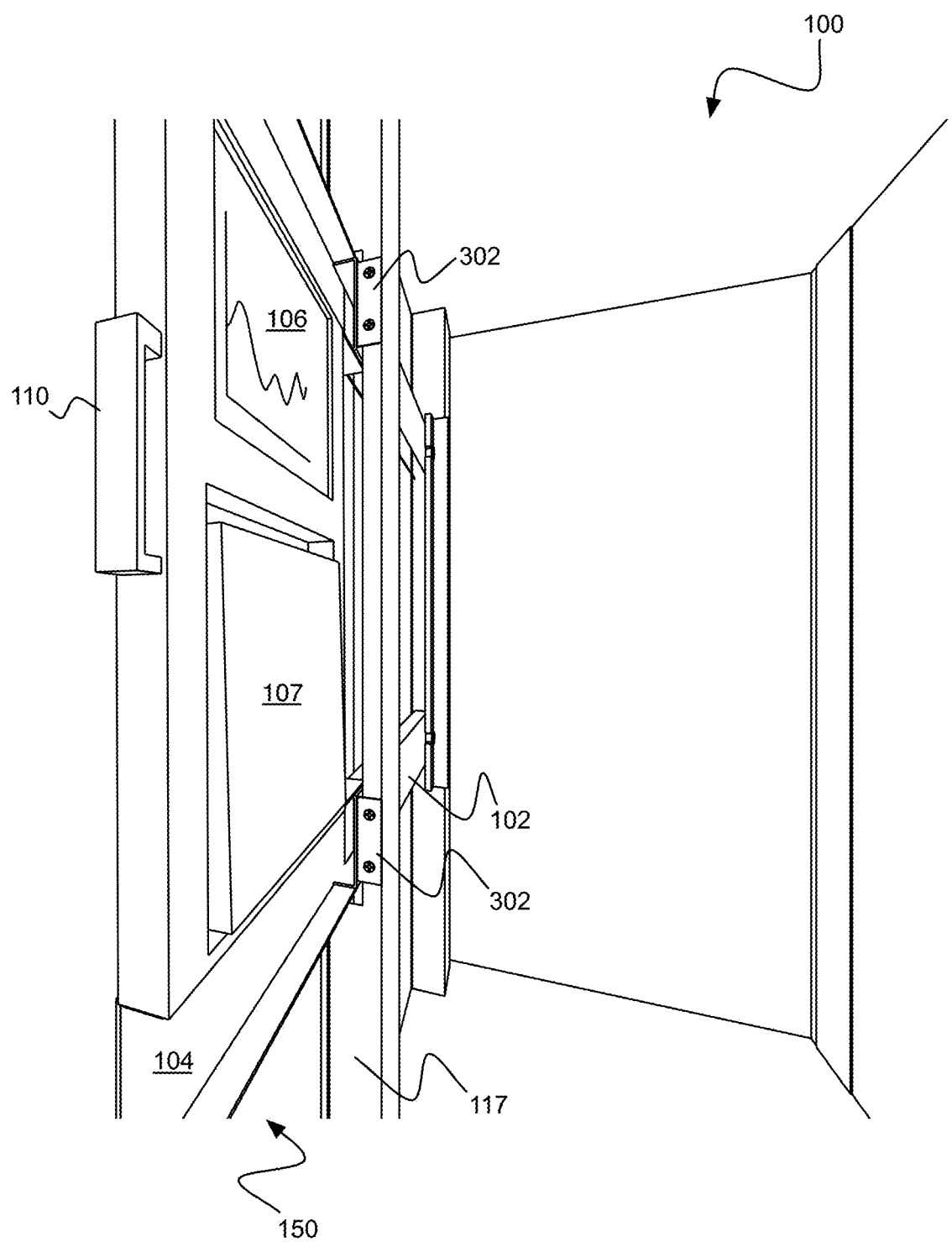
Figure 4:
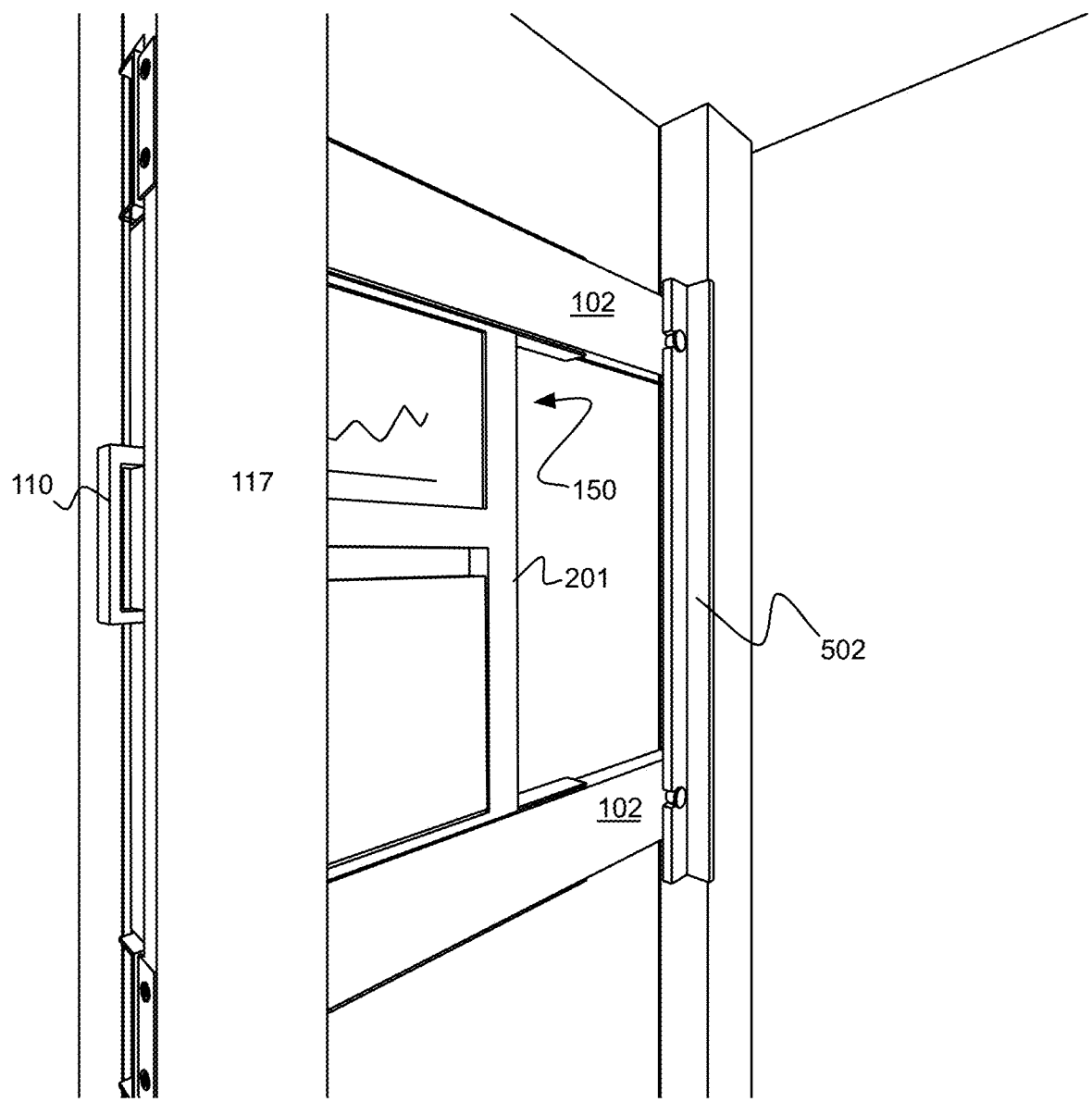

Still yet, referring now to FIGS. 3 and 4, pivotally mounting the input device 107 allows the input device 107 to be folded away into a generally vertical orientation when the retractable terminal 150 is unused or being stowed within the sidewall 117. For example, in FIG. 3, the input device 107 has been folded up. In this orientation, the input device 107 is not exposed to receive erroneous or unintentional user input. A user viewing the display 106 but not providing input via the input device 107 may leave the input device 107 folded up and inaccessible. Moreover, with the input device 107 in this orientation, the retractable terminal 150 may be retracted within the sidewall 117 without physical impediment due to the input device 107.

For example, referring now to FIG. 4, the retractable terminal 150 has been retracted within the sidewall 117. When the retractable terminal 150 is retracted within the sidewall 117, an exterior door (not shown) of the server rack 100 may be closed and/or locked to prevent unauthorized access to the contents of the server rack 100. Also, closing the exterior door of the server rack 100 may improve airflow within the server rack 100, thereby cooling the electronic components within. Accordingly, the retractable terminal 150 may remain in a generally vertical orientation both when in use and when being stored within the sidewalls 116 and 117 of the server rack 100.

As illustrated by FIG. 4, the handle 110 may remain externally accessible to a user when the retractable terminal 150 is within the sidewall 117. In other words, when the retractable terminal 150 is within the sidewall 117, the handle 110 may remain accessible to a user that is outside of the server rack 100. For example, the user may be standing facing the front face 120 of the server rack 100. When the user pulls on the handle 110, the retractable terminal 150 may extend out of the aperture 130 of the server rack 100 by gliding along a path provided by the fixed rails 102. The handle 110 may comprise any fixture of the retractable terminal 150 that is accessible from outside of the server rack 100 when the retractable terminal 150 has been retracted within the server rack 100, and capable of withstanding the push/pull forces of a user retracting/extending the retractable terminal 150.

With the retractable terminal 150 housed entirely within or along a sidewall of the server rack 100, air may flow unimpeded throughout the server rack 100, thereby ensuring that the electronic components within the server rack 100 are adequately cooled.

Figure 5:
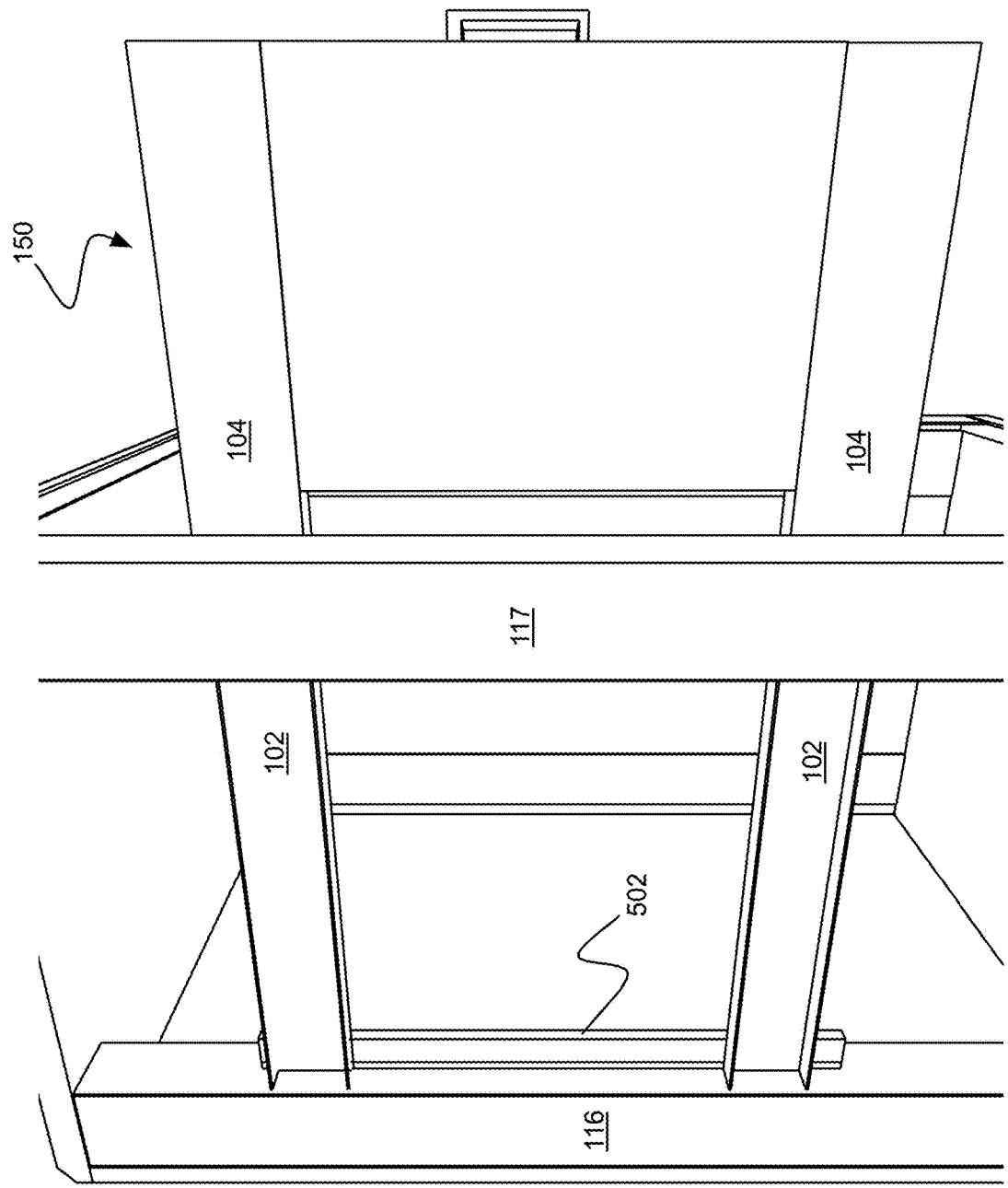
Figure 6:
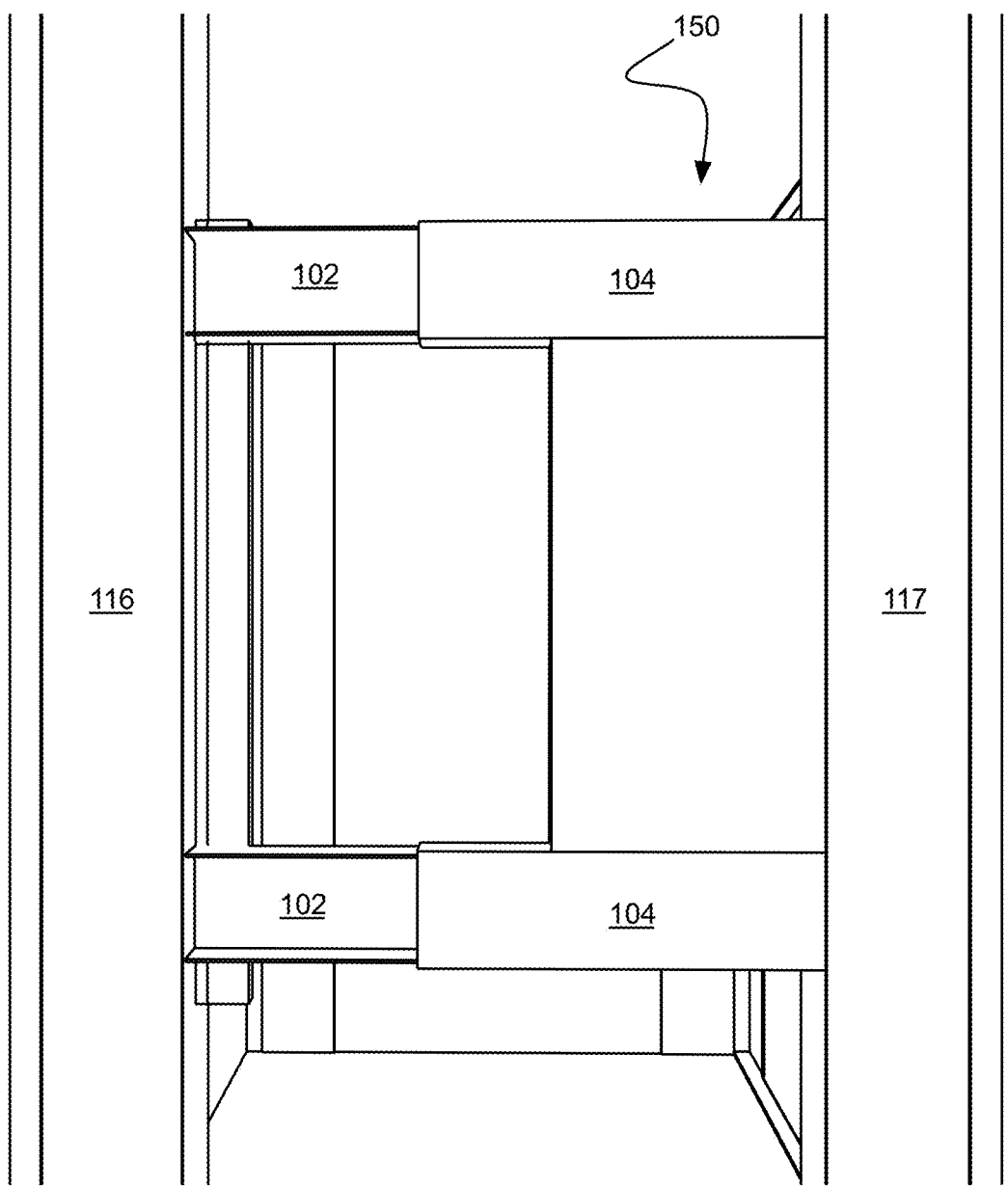

FIGS. 5 and 6 illustrate perspective views of the left side 126 of the server rack 100 with the retractable terminal 150 extended (FIG. 5) and with the retractable terminal 150 retracted (FIG. 6). Visible in FIG. 5 is a rear bracket 502, which is discussed in more detail in the context of FIGS. 8A-8B.

Figure 7:
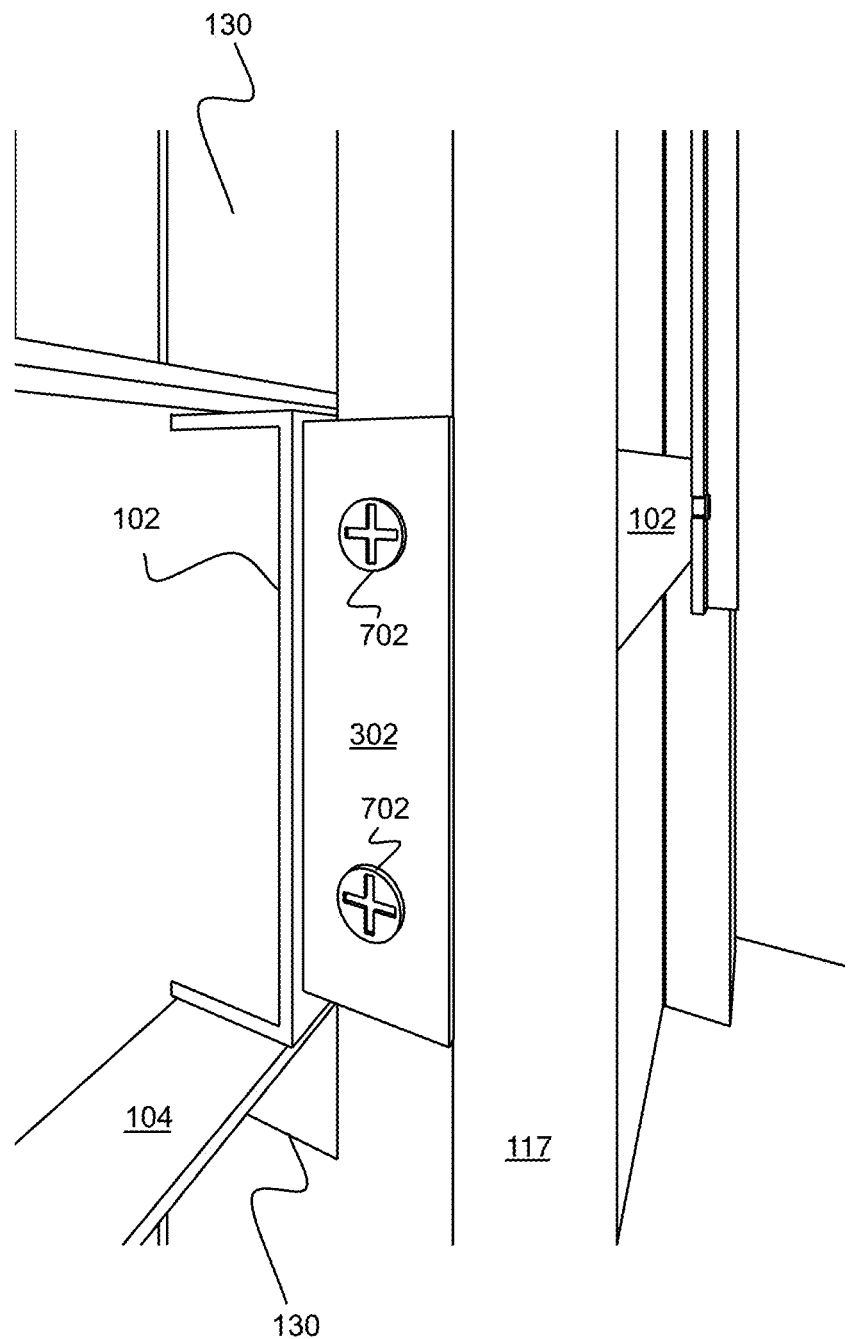
FIG. 7 is a stopper plate, according to one embodiment.

FIG. 7 depicts a stopper plate 302 of a fixed rail 102, in accordance with one embodiment. As an option, the present stopper plate 302 may be implemented in conjunction with features from any other embodiment listed herein, such as those described with reference to the other FIGS. Of course, however, such stopper plate 302 and others presented herein may be used in various applications and/or in permutations which may or may not be specifically described in the illustrative embodiments listed herein. Further, the stopper plate 302 presented herein may be used in any desired environment.

In some embodiments, a stopper plate 302 may be attached to a fixed rail 102 for convenient mounting of the fixed rail 102 to the sidewall 117. Where the server rack 100 includes multiple fixed rails 102, each fixed rail 102 may be attached to a stopper plate 302. Further, each of the stopper plates 302 may be mounted to the same sidewall.

As shown in FIG. 7, the stopper plate 302 comprises a plate that is formed at or attached to an end of the fixed rail 102. The stopper plate 302 is shown to extend from the fixed rail 102 in a direction that is generally orthogonal to the direction of travel of the retractable terminal 150 along the fixed rail 102. As an option, this orientation may ensure that the stopper plate 302 is parallel with and adjacent to an edge of the sidewall 117 that is parallel with the front face 120 of the server rack 100. In one embodiment, the stopper plate 302 and the fixed rail 102 may be formed or manufactured in a unitary manner, such that they are components of a single contiguous piece of metal or plastic. In another embodiment, the stopper plate 302 may be attached to the fixed rail 102 using fasteners. For example, the stopper plate 302 may be attached to the fixed rail 102 using one or more of bolts, screws, rivets, adhesives, welds, etc.

The stopper plate 302 may be used to secure or attach the fixed rail 102 to the sidewall 117. In one embodiment, the fixed rail 102, with the stopper plate 302 attached, may be inserted into the server rack 100 during assembly. In particular, the fixed rail 102 may be inserted into the aperture 130 and slid directly back, in a direction parallel with the sidewalls 116 and 117, toward the rear face 124. After the fixed rail 102 contacts a rear of the aperture 130, and/or the stopper plate 302 contacts a front face of the sidewall 117, fasteners 702 may be used to secure the stopper plate 302 to the sidewall 117. After the fasteners 702 have secured the fixed rail 102, the fasteners 702 may prevent any further movement of the fixed rail 102 with respect to the server rack 100. In some embodiments, the fixed rails 102 may be installed to only a fraction (e.g., ⅓, ½, ¾, etc.) of the depth of the server rack 100. In other words, when retracted within the server rack 100, the retractable terminal 150 may occupy only a portion of the total depth of the server rack 100.

Figure 8A:
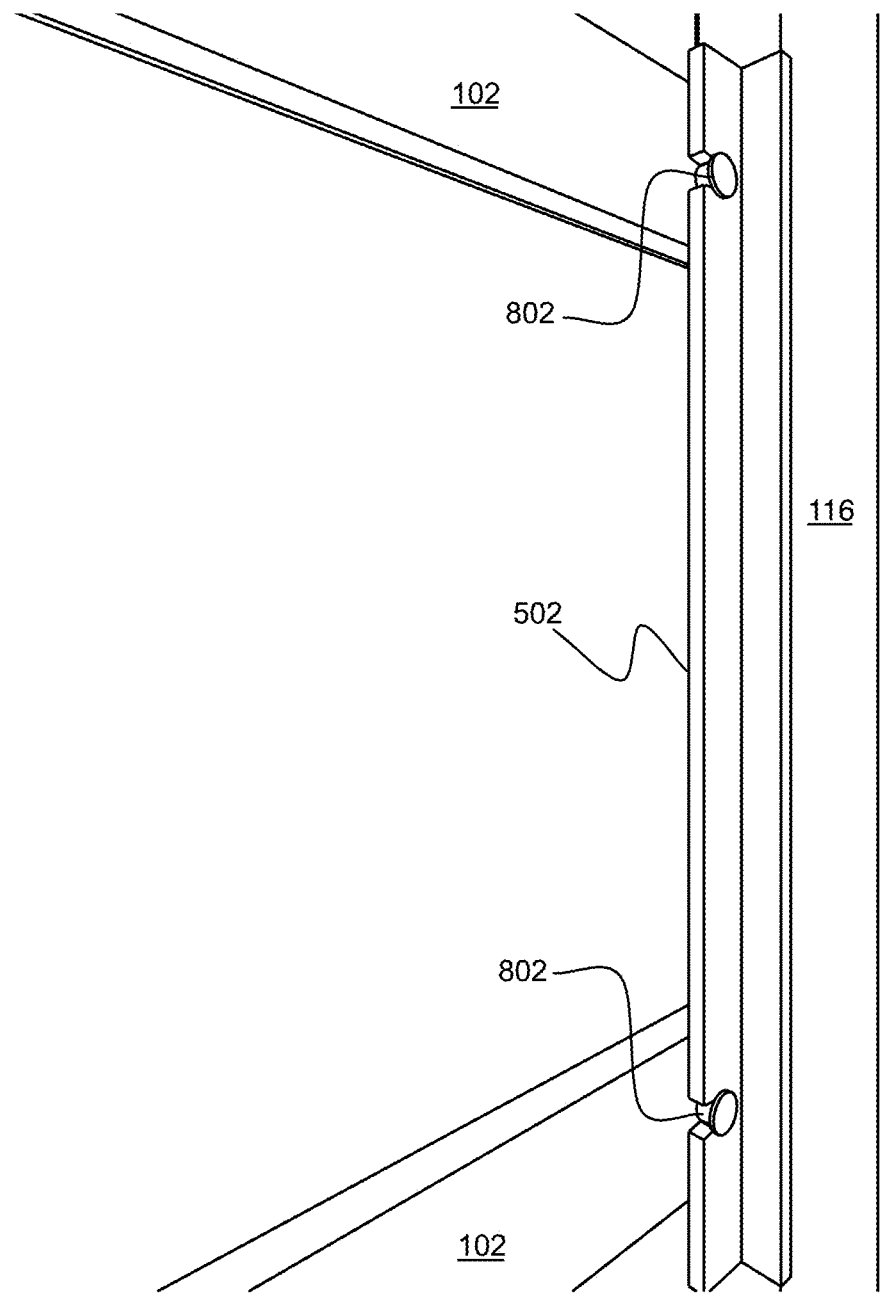
FIGS. 8A-8B is an attachment mechanism, according to one embodiment.
Figure 8B:
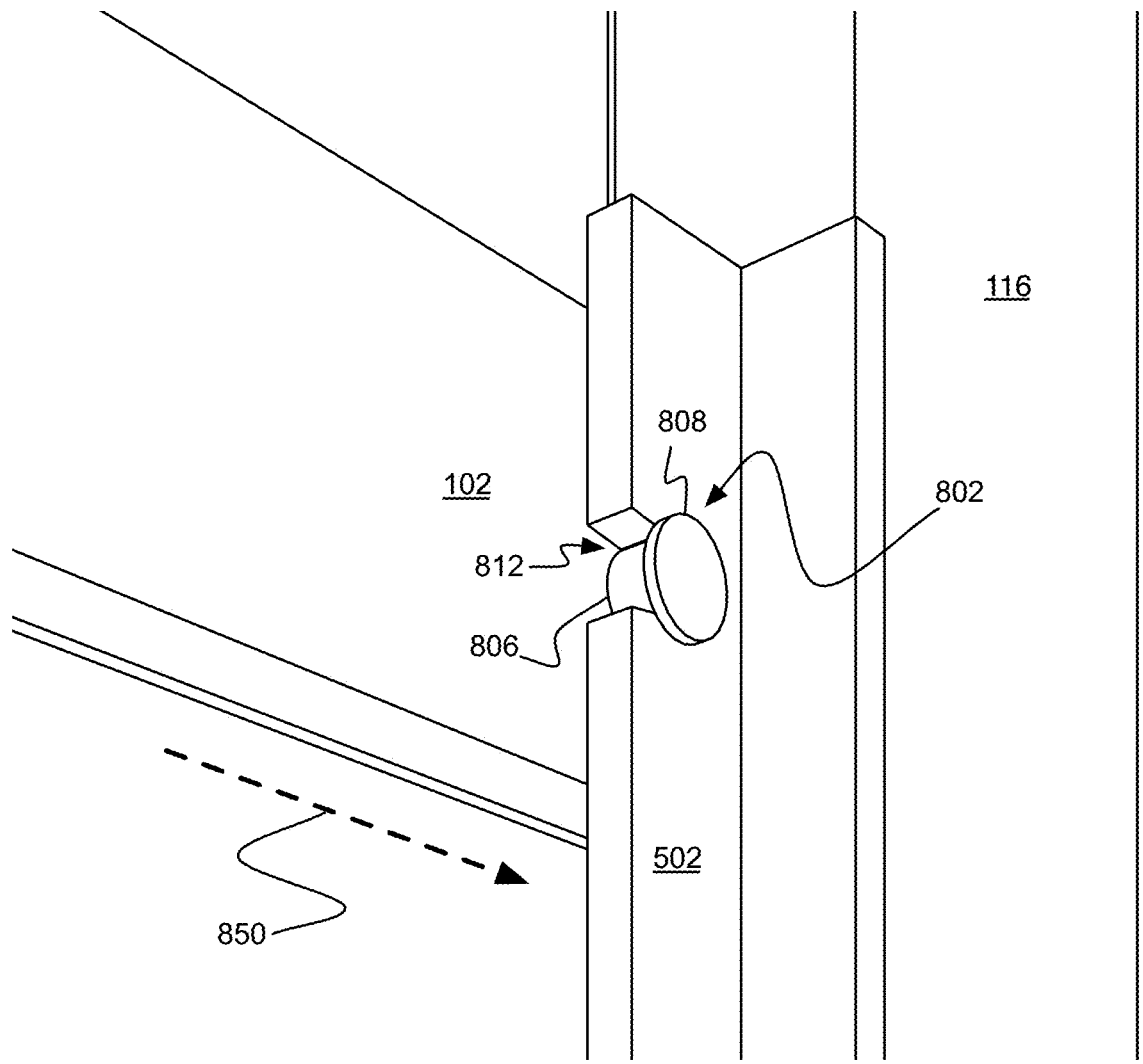

FIGS. 8A-8B depict an attachment mechanism for the fixed rails 102, in accordance with one embodiment. As an option, the attachment mechanism may be implemented in conjunction with features from any other embodiment listed herein, such as those described with reference to the other FIGS. Of course, however, such attachment mechanism and others presented herein may be used in various applications and/or in permutations which may or may not be specifically described in the illustrative embodiments listed herein. Further, the attachment mechanism presented herein may be used in any desired environment.

Referring now to FIG. 8A, a rear bracket 502 is shown attached to the sidewall 116. Further, the rear bracket 502 is shown to comprise an L-shaped bracket that is attached to the sidewall 116. Although FIGS. 8A and 8B illustrate the rear bracket 502 as being an elongated L-shaped bracket, it is understood that the rear bracket 502 may be embodied in any conformation suitable for fixedly mounting the fixed rail 102 to the sidewall 116.

In one embodiment, the rear bracket 502 and the sidewall 116 may be formed or manufactured in a unitary manner, such that they are components of a single contiguous piece of metal or plastic. In another embodiment, the rear bracket 502 may be attached to the sidewall 116 using fasteners. For example, the rear bracket 502 may be attached to the sidewall 116 using one or more of bolts, screws, rivets, adhesives, welds, etc.

Each of the fixed rails 102 is shown to include a mushroom pin 802. In one embodiment, the mushroom pin 802 and the fixed rail 102 may be formed or manufactured in a unitary manner, such that they are components of a single contiguous piece of metal or plastic. In another embodiment, the mushroom pin 802 may be attached to the fixed rail 102 using fasteners. For example, the mushroom pin 802 may be threaded into, bolted to, riveted to, welded to, adhered to, etc. the fixed rail 102.

As illustrated by FIG. 8B, the mushroom pin 802 includes a post 806 that extends from the fixed rail 102, with a flange 808 on the distal end of the post 806. In one embodiment, the post 806 may be generally cylindrical with a first diameter, and the flange 808 may be generally cylindrical with a second diameter that is greater than the first diameter of the post 806. In other embodiments, the post 806 and/or the flange 808 may have other geometric profiles (e.g., square, pentagonal, octagonal, etc.).

The mushroom pin 802 may interface with the rear bracket 502 such that the fixed rail 102 is fixedly mounted to the sidewall 116. In particular, a notch 812 of the rear bracket 502 may receive the post 806 of the mushroom pin 802 as the fixed rail 102 is inserted along the insertion direction 850. The diameter of the post 806 of the mushroom pin 802 may be substantially identical to, or less than, a diameter of a notch 812 in the rear bracket 502. Further, the diameter of the flange 808 of the mushroom pin 802 may be greater than the diameter of the notch 812 in the rear bracket 502.

Thus, when the fixed rail 102 has been inserted along the insertion direction 850 such that the mushroom pin 802 is seated in the notch 812, all movement of the fixed rail 102 in any direction other than one directly opposite of the insertion direction 850 may be prohibited. Moreover, if the fixed rail 102 is anchored to prevent any movement opposite to the insertion direction 850, e.g., using a stopper plate 302 and fasteners 702, then the fixed rail 102 may be securely attached to the sidewalls 116 and 117 in a manner that precludes any and all movement of the fixed rail 102 relative to the server rack 100.

Utilizing the mushroom pin and notch system of FIGS. 8A-8B in conjunction with the stopper plate system described in the context of FIG. 7 may provide a slider system that is user-serviceable without requiring specialized tooling or direct access to the side (i.e., the left side 126) of the server rack 100. In other words, a user at the front face 120 of the server rack 100 may securely install the fixed rails 102 without requiring access to the rear or sides of the server rack 100. After installing the fixed rails 102 within the server rack 100, the sliding rails 104 and retractable terminal 150 may be slideably installed onto the fixed rails 102. Accordingly, in a commercial server environment, where the rear and sides of the server rack 100 are generally inaccessible due to the tight side-by-side packing of multiple server racks 100, the mushroom pin and notch system of FIGS. 8A-8B, in conjunction with the stopper plate system of FIG. 7, may ensure that the sliding rail mechanism of the server rack 100 can be installed, repaired, or replaced with relative ease.

Of course, it is contemplated that in some embodiments, the fixed rails 102 may be more permanently affixed within the sidewalls 116 and 117. In one embodiment, the fixed rails 102 may be affixed directly to the server rack 100 without using a rear bracket 502. For example, the fixed rails 102 may be bolted, riveted, or welded to the server rack 100. In some embodiments other, attachment mechanisms may be used for attaching the fixed rails 102 to the server rack 100.

For example, tabs, slots, pins, hooks, etc. may be used for attaching the fixed rails 102 to the server rack 100.

Figure 9A:
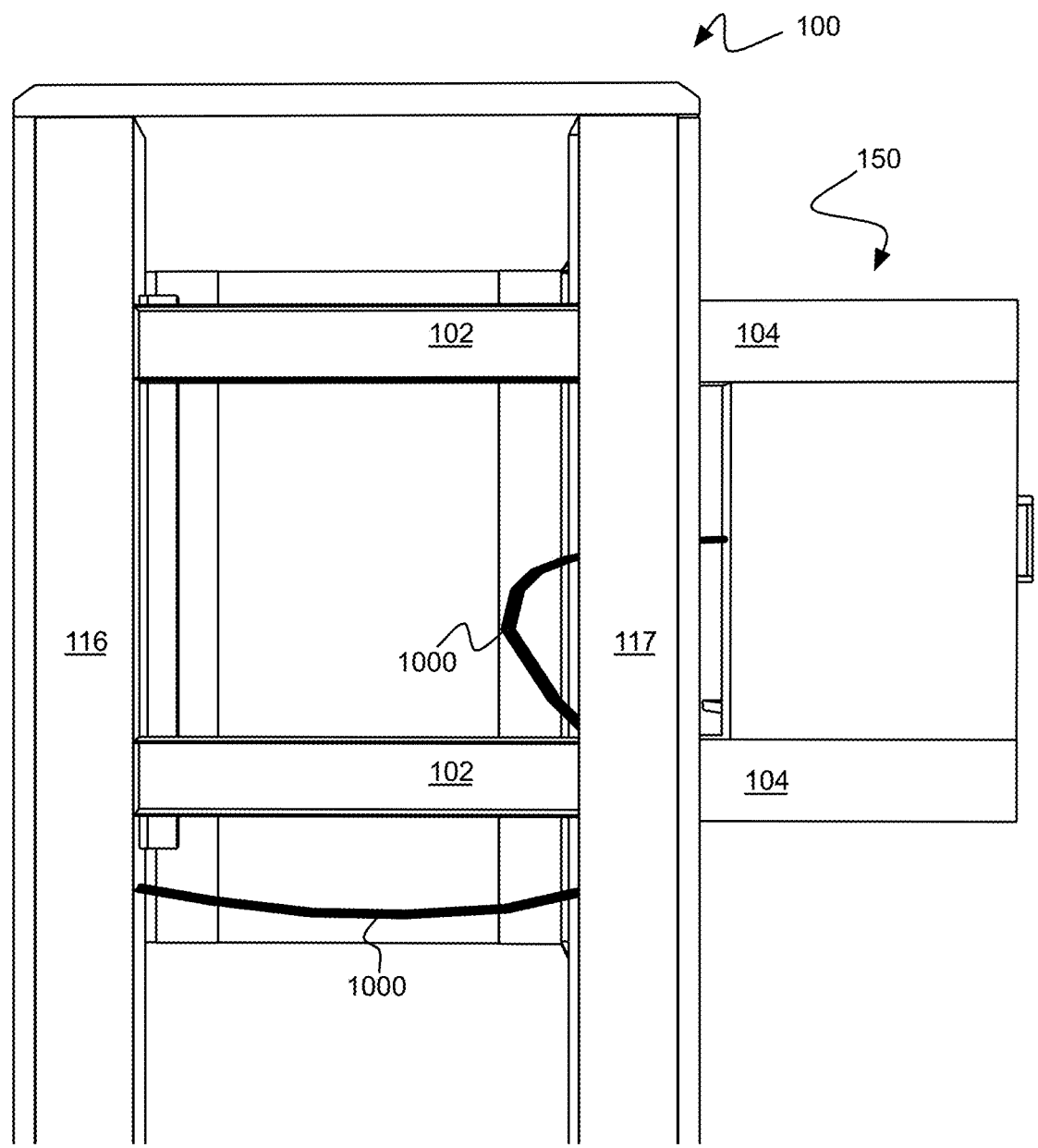
FIG. 9A is a partial side view of a server rack with cable routing, according to one embodiment.
Figure 9B:
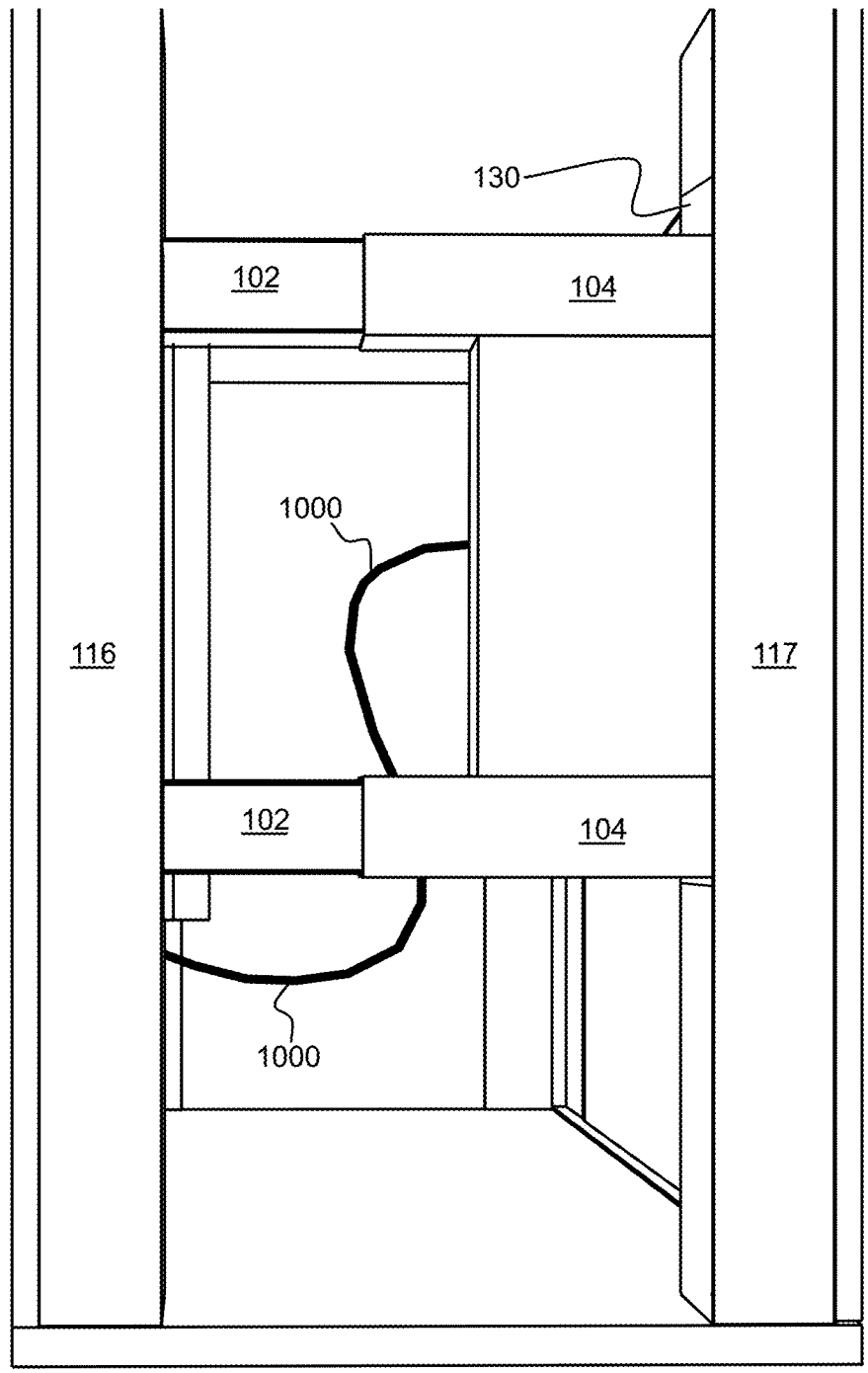
FIG. 9B is a partial side view of the server rack of FIG. 9A.
Figure 9C:
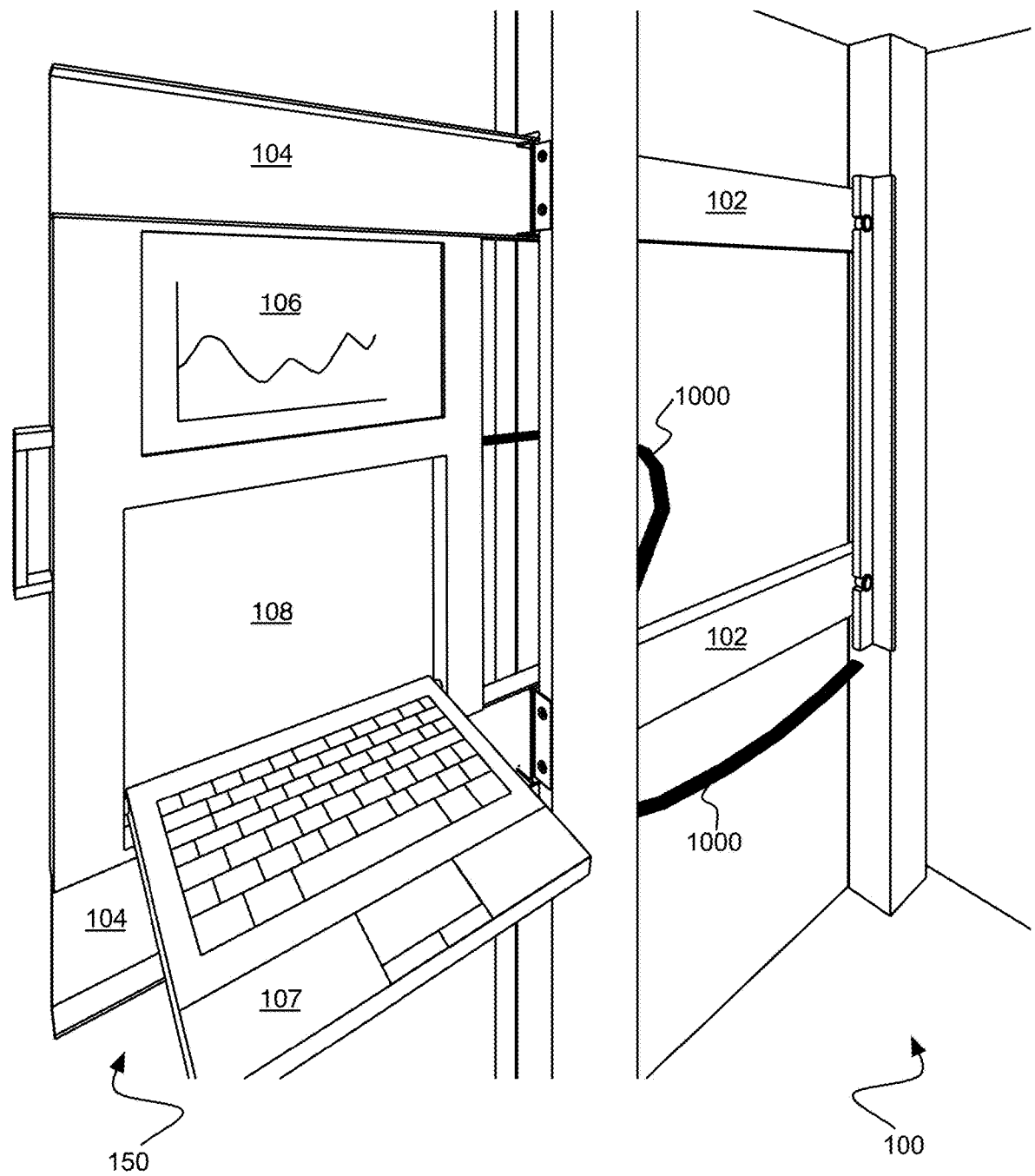
FIG. 9C is a partial perspective view of the server rack of FIGS. 9A-9B.

FIGS. 9A-9C depict a routing of a cable loop 1000, in accordance with one embodiment. As an option, the routing of the cable loop 1000 may be implemented in conjunction with features from any other embodiment listed herein, such as those described with reference to the other FIGS. Of course, however, such routing of the cable loop 1000 and others presented herein may be used in various applications and/or in permutations which may or may not be specifically described in the illustrative embodiments listed herein. Further, the cable loop 1000 presented herein may be used in any desired environment.

FIGS. 9A and 9B illustrate perspective views of the left side 126 of the server rack 100 with the retractable terminal 150 extended (FIG. 9A) and with the retractable terminal 150 retracted (FIG. 9B). In both of FIGS. 9A and 9B, a cable loop 1000 extends from the retractable terminal 150 at a location approximately midway between the sliding rails 104 of the retractable terminal 150. FIG. 9C illustrates a perspective view from the front of the server rack 100, with the retractable terminal 150 extended. In FIG. 9C, the cable loop 1000 extends from the retractable terminal 150 at a location approximately midway between the sliding rails 104 of the retractable terminal 150. As an option, the cable loop 1000 may be anchored toward the rear of the server rack 100. Further, the cable loop 1000 may be anchored at a point lower than where the cable loop 1000 exits the retractable terminal 150. As illustrated by FIGS. 9A-9C, the cable loop 1000 is able to move freely as the retractable terminal 150 slides along the fixed rails 102 for extending out of and retracting into the server rack 100.

In various embodiments, the cable loop 1000 may include one or more of power, data, and video cables. For example, the cable loop 1000 may include a video cable that provides a video signal to the display 106. As another example, the cable loop 1000 may include a Universal Serial Bus (USB) cable for transmitting input/output signals (e.g., trackpad input, key-presses, etc.) from/to the input device 107. Still yet, the cable loop 1000 may include a network cable for providing network connectivity to computing hardware of the retractable terminal 150.

FIGS. 10A-10G depict a server rack 1020, in accordance with one embodiment. As an option, the server rack 1020 may be implemented in conjunction with features from any other embodiment listed herein, such as those described with reference to the other FIGS. Of course, however, such server rack 1020 and others presented herein may be used in various applications and/or in permutations which may or may not be specifically described in the illustrative embodiments listed herein. Further, the server rack 1020 presented herein may be used in any desired environment.

Figure 10A:
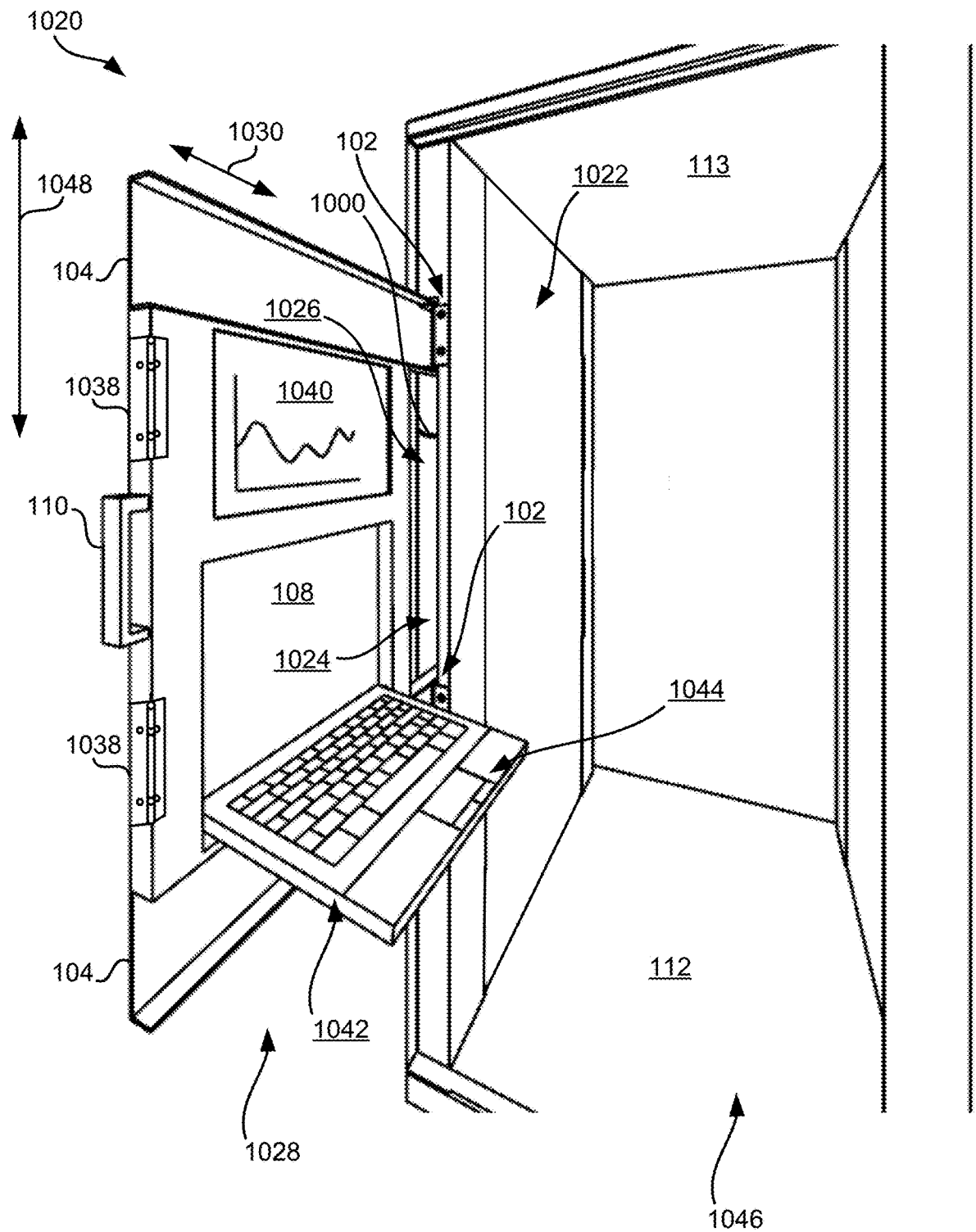
FIG. 10A is a partial perspective view of a server rack having a retractable terminal in an extended position and a pivoting frame in an undeployed position, according to one embodiment.

Referring first to FIG. 10A, the server rack 1020 includes a base 112, a top 113 and a sidewall 1022. The sidewall 1022 defines an interior 1024. The server rack 1020 further includes an aperture 1026 in the sidewall 1022.

Moreover, the server rack 1020 includes a retractable terminal 1028. In the present approach, the retractable terminal 1028 horizontally positionable between a retracted position and an extended position. For example, the retractable terminal 1028 is in the retracted position in FIG. 10E. Note that in one approach, in the retracted position, the retractable terminal 1028 is positioned in the interior 1024. In contrast, the retractable terminal 1028 is in various degrees of the extended position in FIGS. FIGS. 10A-10D. For example, with joint reference to FIGS. 10A-10C, the retractable terminal 1028 is fully extended. In another example, with reference now to FIG. 10D, the retractable terminal 1028 is only partially extended.

In one approach, the retractable terminal 1028 is configured to extend, e.g., move, through the aperture 1026 of the sidewall 1022 when transitioning from the retracted position to the extended position. Accordingly, in one approach, a contour of the aperture 1026 of the sidewall 1022 about matches a cross sectional profile of the retractable terminal 1028 that passes therethrough. Having the contour of the aperture 1026 of the sidewall 1022 about match the cross sectional profile of the retractable terminal 1028 that passes therethrough may conserve server rack space and prevent the server rack 1020 from being unnecessarily bulky.

In order to extend through the aperture 1026 of the sidewall 1022 when transitioning from the retracted position to the extended position, in one approach, the server rack 1020 includes sliding rails 104 and fixed rails 102. Specifically, the sliding rails 104 are configured to slide along the fixed rails 102.

In one approach, each pairing of a fixed rail 102 and sliding rail 104 (first pairing that resides near an upper portion of the retractable terminal 1028 and second pairing that resides near a lower portion of the retractable terminal 1028) may include a drawer slide assembly. The fixed rails 102 of the server rack 1020 may be attached at least to the sidewall 1022, e.g., aligning the fixed rails 102 along a retracting/extending direction 1030 of the retractable terminal 1028. In this manner, the retractable terminal 1028 provides display and input devices (described elsewhere herein) on a generally vertically oriented sliding drawer that does not consume any rack unit space within the server rack 1020.

Although FIGS. 10A-10G depict the server rack 1020 as including two pairs of sliding rails 104 and fixed rails 102, other embodiments and/or approaches may include any number of pairs of sliding rails 104 and fixed rails 102, for providing adequate support and rigidity for use in reliably extending and retracting the retractable terminal 1028.

The retractable terminal 1028 includes a handle 110. The handle of the retractable terminal 1028 is available to assist a user in gripping the retractable terminal 1028, e.g., for pushing/sliding the retractable terminal 1028 in the direction 1030 into the retracted position and/or for pulling/sliding the retractable terminal 1028 in the direction 1030 into the extended position.

Figure 10B:
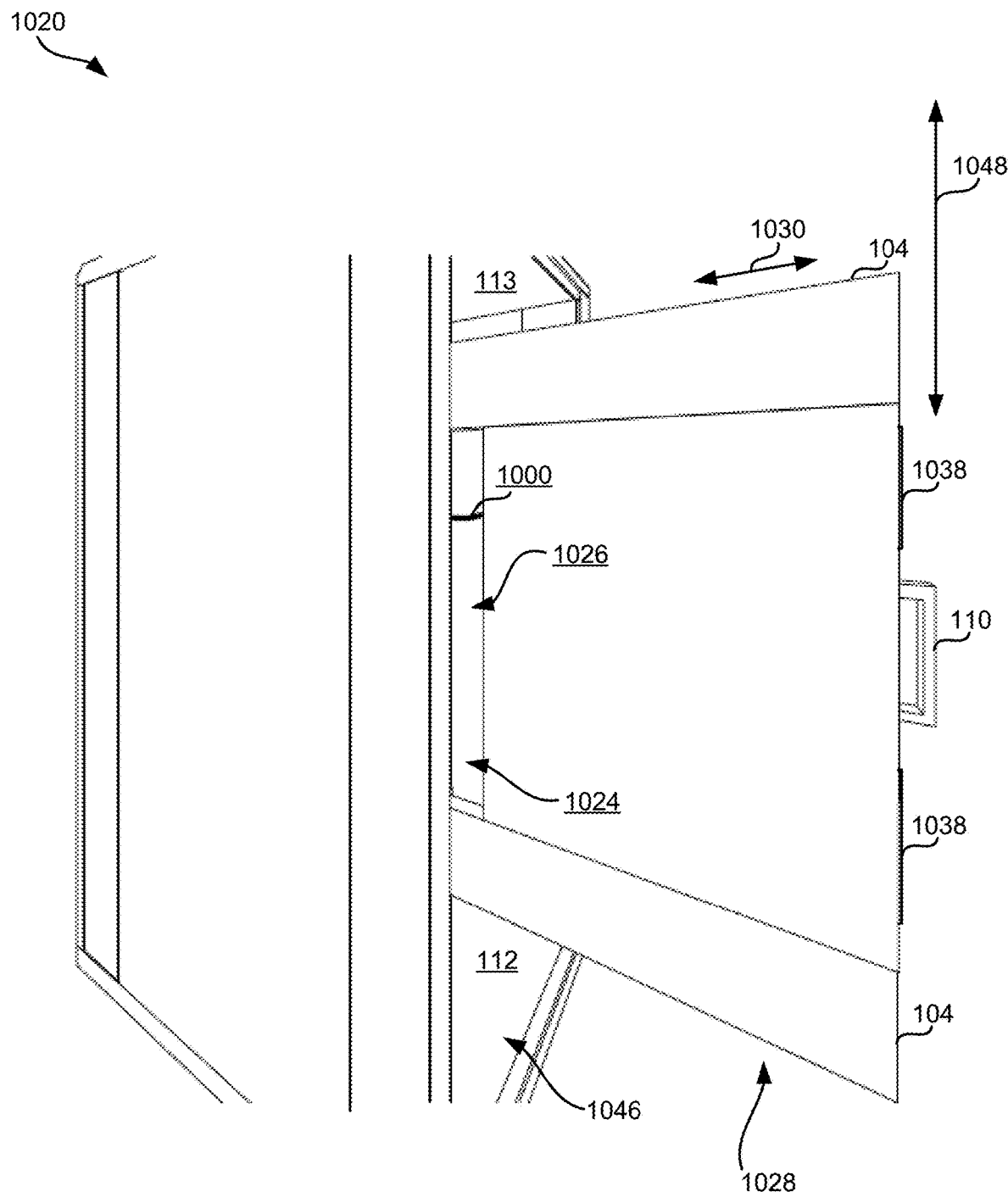
FIG. 10B is a partial perspective view of the server rack of FIG. 10A.
Figure 10C:
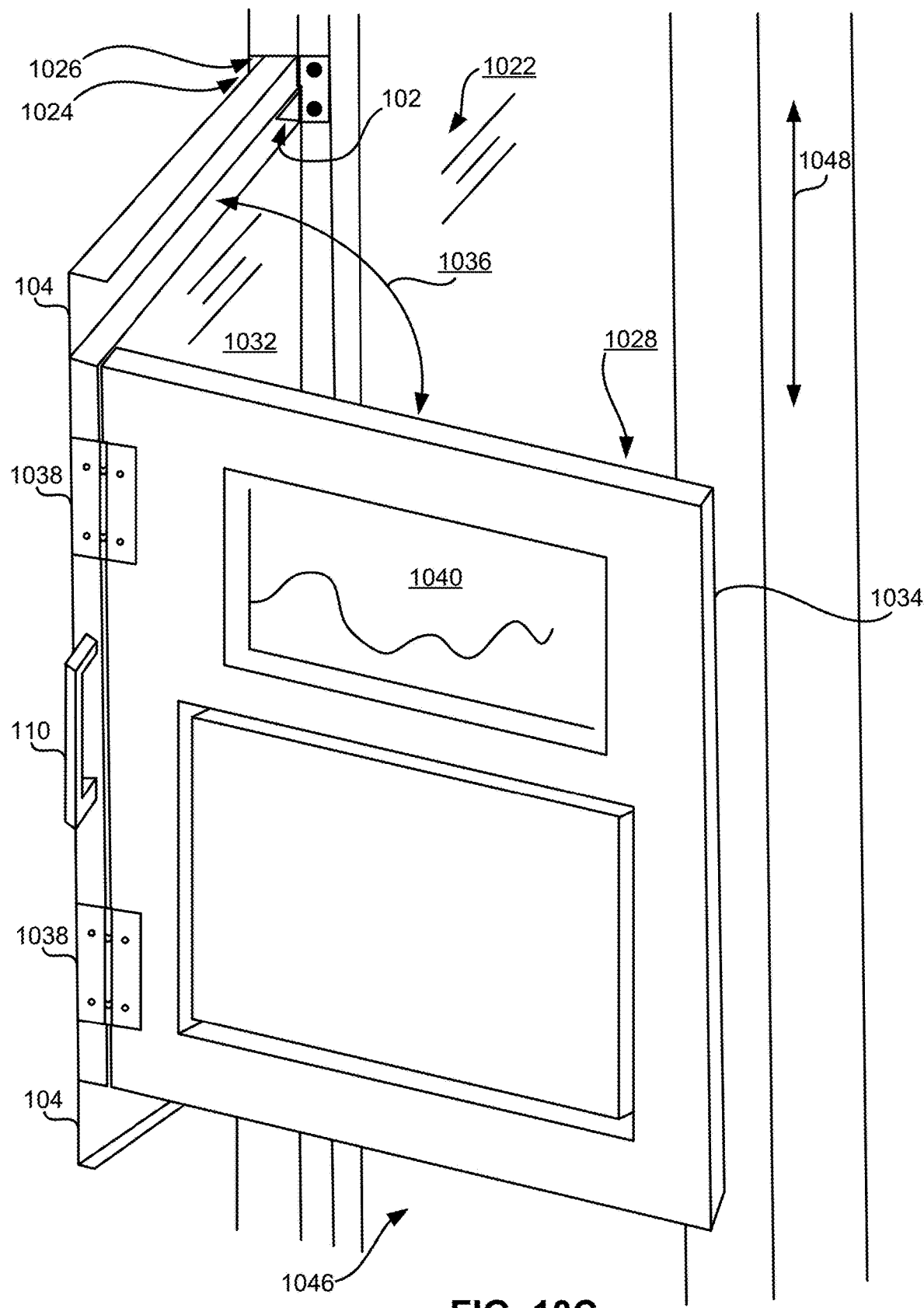
FIG. 10C is a partial perspective view of the server rack of FIGS. 10A-10B, with the pivoting frame in a deployed position.
Figure 10D:
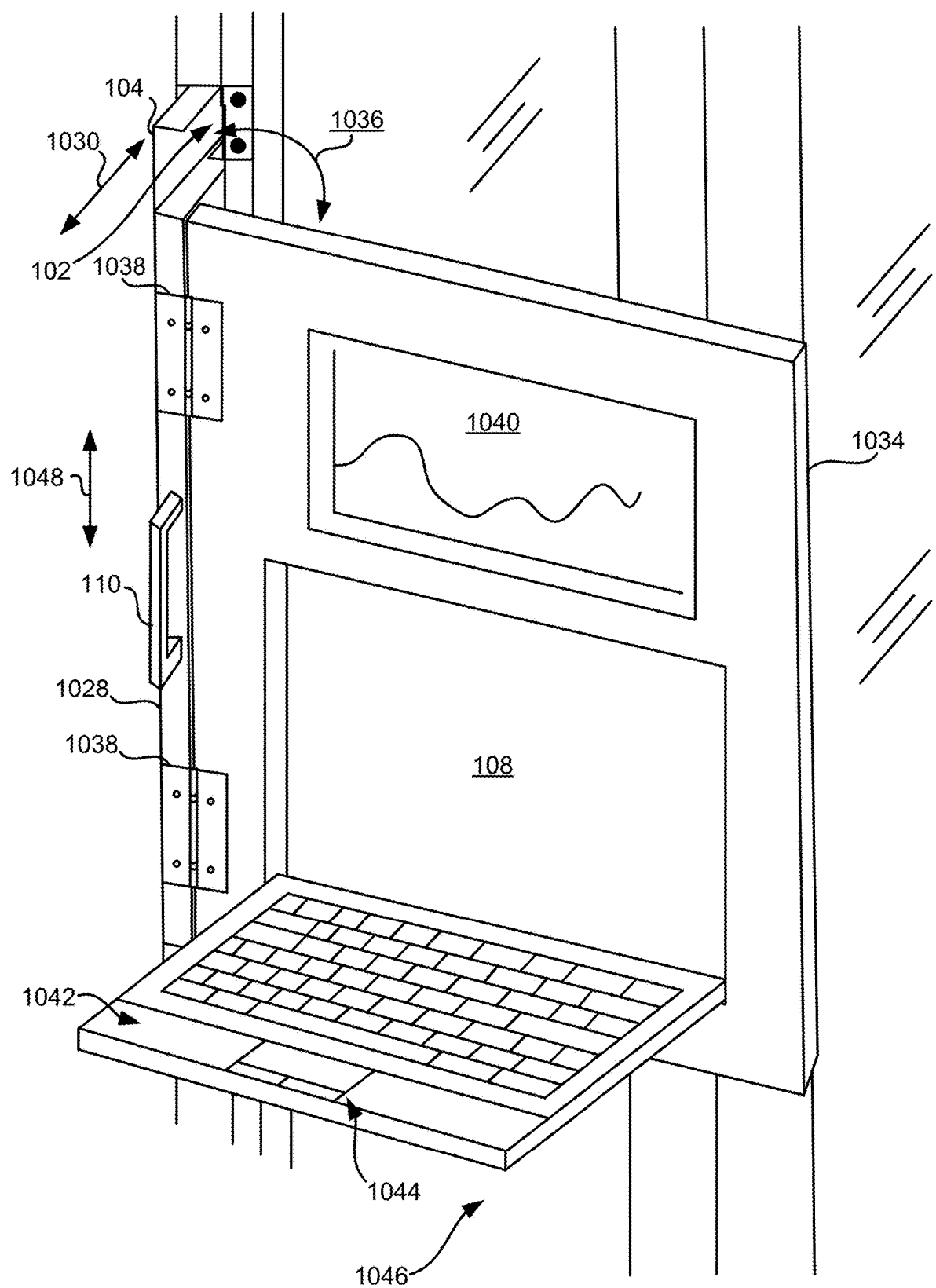
FIG. 10D is a partial perspective view of the server rack of FIGS. 10A-10C, with the retractable terminal in a partially retracted position and the pivoting frame in a deployed position.
Figure 10E:
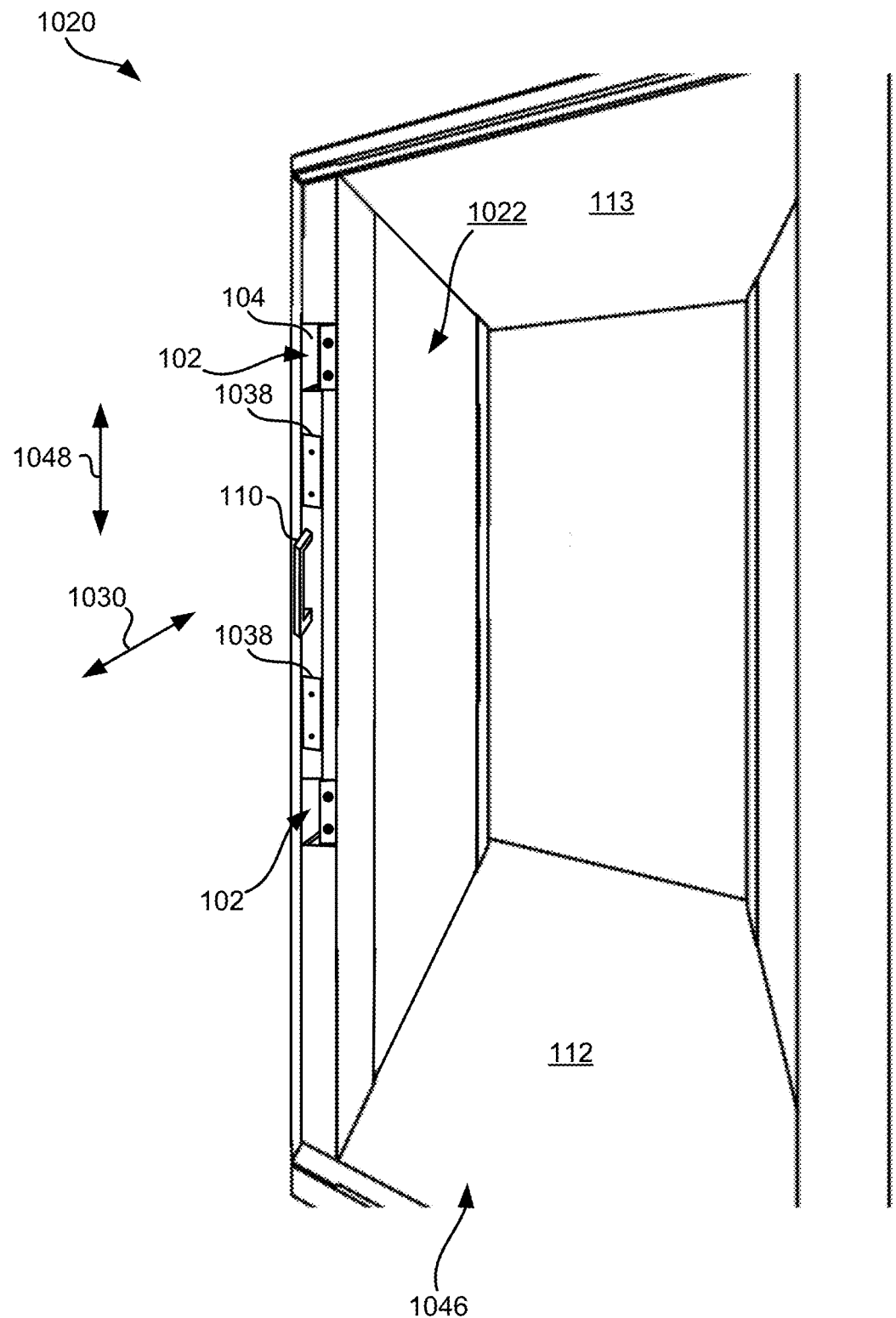
FIG. 10E is a partial perspective view of the server rack of FIGS. 10A-10D, with the retractable terminal in a retracted position and the pivoting frame in the undeployed position.

In one approach, the handle 110 may be accessible at all times, e.g., regardless of whether the retractable terminal 1028 is in the retracted position, e.g., see FIG. 10E, or is in extended position, e.g., see FIGS. 10A-10D.

In another approach, the handle 110 may be selectively accessible to a user. For example, in one approach, a lock (not shown) may selectively cover and/or block access to the handle 110.

Moreover, in some approaches, the handle 110 may reside beyond an outmost face of the aperture 1026 of the sidewall 1022 when the retractable terminal 1028 is in the retracted position. However, in other approaches, the handle 110 may reside at least partially within the sidewall 1022 when the retractable terminal 1028 is in the retracted position. In further approaches, the handle may be retractable so as not to extend significantly beyond the outmost face of the aperture 1026 of the sidewall 1022 when the retractable terminal 1028 is in the retracted position.

In the extended position (partially or fully extended), a user may utilize the retractable terminal 1028 as a work station. For example, according to various approaches, the retractable terminal 1028 includes an input device. According to various approaches, the retractable terminal 1028 includes any type and/or configuration of input devices. For example with reference to FIG. 10A, in one approach, the input device includes a keyboard 1042. In another approach, the input device additionally and/or alternatively includes a mouse 1044, e.g., which may be a touchpad mouse as shown in the server rack 1020, or any other known type of computer mouse.

Moreover, in one approach, the retractable terminal 1028 includes a display 1040. According to various approaches, the display 1040 includes any known type of display, e.g., a touch-sensitive input display, a LCD, a LED display, etc.

In yet further approaches, the retractable terminal 1028 additionally and/or alternatively includes a tablet computer.

Figure 12:
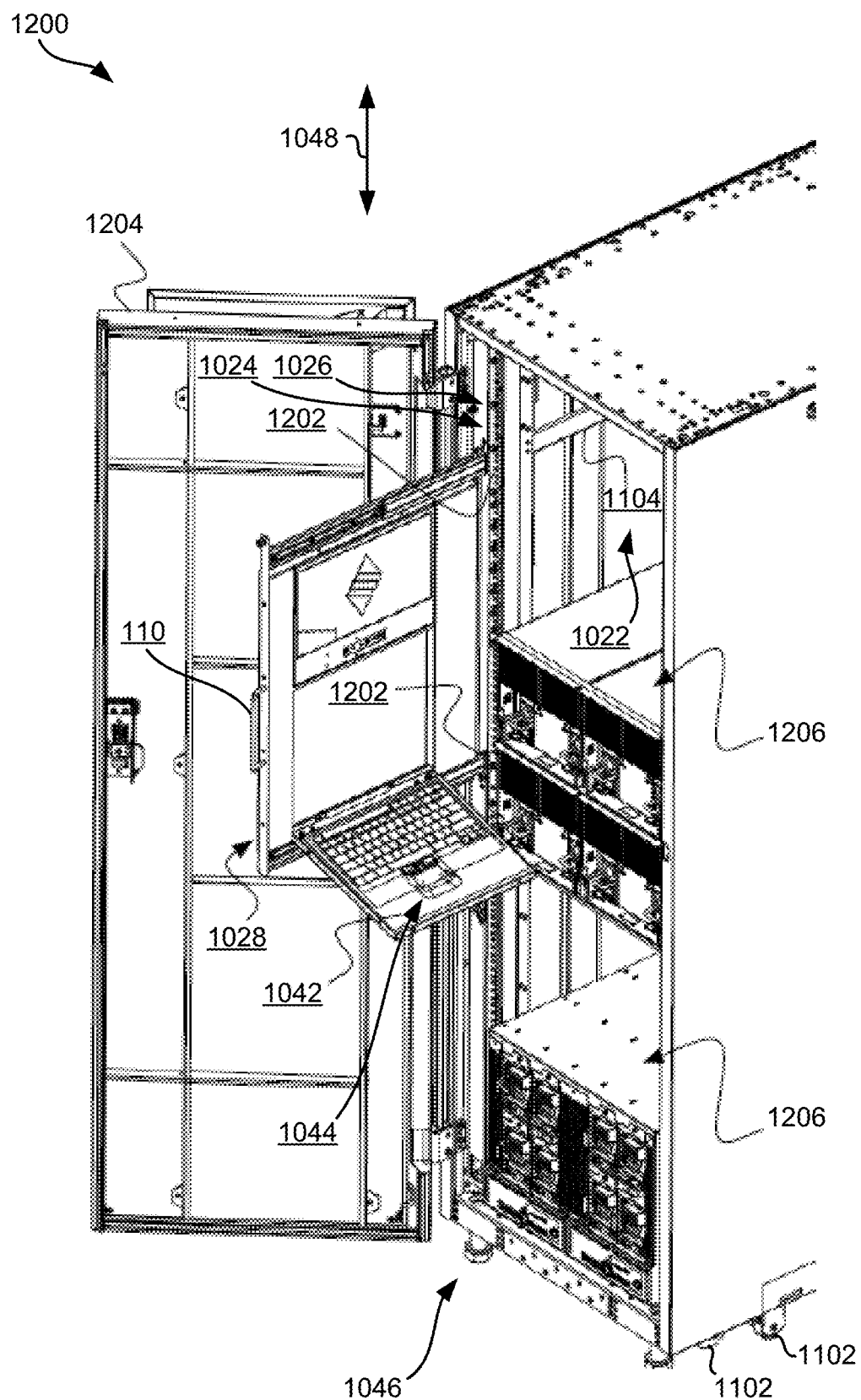
FIG. 12 is partial perspective view of a server rack having a door and a retractable terminal in an extended position, according to one embodiment.

In the extended position, the retractable terminal 1028 provides a work station for a user, that is proximate to network hardware in the server rack 1020, e.g., computers, servers, drives, etc., housed in the server rack 1020 (none shown in server rack 1020, although computer and network hardware may at some point be mounted in server rack 1200 of FIG. 12). It should be noted that when not being used, the retractable terminal 1028 does not consume space within a storage interior 1046 of the server rack 1020. Instead, the retractable terminal 1028 is housed within a vertical space of the interior 1024 when in the retracted position. Recall that the sidewall 1022 defines the interior 1024, and thus in the retracted position and in the extended position, the retractable terminal 1028 preferably is of a narrow dimension that does not consume U rack space that would otherwise be available for housing servers or other network hardware. Specifically, in preferred approaches, the interior 1024 is integrated within structural components of the server rack 1020, e.g., passes through or is directly adjacent to the fixed rails 102 and/or EIA rails of the server rack 1020.

In addition to the retractable terminal 1028 being configured to allow a user to utilize the retractable terminal 1028 as a work station in the extended position as shown in FIGS. 10A-10B, as will now be described, the retractable terminal 1028 may be configured to allow a user to face the storage interior 1046 of the server rack 1020 when utilizing the retractable terminal 1028.

For example, referring now to FIG. 10C, the retractable terminal 1028 includes a base frame 1032 and a pivoting frame 1034 pivotally coupled to the base frame 1032. In one approach, the pivoting frame 1034 is positionable between the undeployed position and a deployed position relative to the base frame 1032 when the retractable terminal 1028 is in the extended position. For example, note that in FIG. 10A, the pivoting frame 1034 is not pivoted away from the base frame 1032, and therefore is in the undeployed position. In contrast, in FIG. 10C, the pivoting frame 1034 is pivoted away from the base frame 1032, e.g., pivoted in a circumferential direction 1036, into the deployed position.

According to one approach, the pivoting frame 1034 is about parallel to the base frame 1032 when in the undeployed position, e.g., see FIGS. 10A-10B and FIG. 10E. Moreover, when in the deployed position, the pivoting frame 1034 is oriented at least 30 degrees from the base frame 1032. For example, referring now to FIGS. 10C-10D, the pivoting frame 1034 is in the deployed position, and is oriented about 90 degrees from the base frame 1032.

The pivoting frame 1034 is positionable between the undeployed position and the deployed position via a friction hinge 1038. It should be noted that although in the present approach the pivoting frame 1034 is positionable between the undeployed position and the deployed position via two friction hinges 1038, other approaches may include any configuration and/or known type of hinge(s).

Because a user using the pivoting frame 1034 may apply some force to the pivoting frame 1034, e.g., while typing on the keyboard 1042, the orientation of the pivoting frame 1034 relative to base frame 1032 may be temporarily locked in place by a pivot prevention mechanism, e.g., to selectively prevent the pivoting frame 1034 from pivoting toward and/or away from the base frame 1032. For example, in one approach, the pivoting frame 1034 and/or the base frame 1032 includes an adjustable wedge coupled thereto for at least temporarily locking the orientation of the pivoting frame 1034 relative to base frame 1032. In another approach, at least one of the friction hinges 1038 includes a lock/pin for at least temporarily preventing an orientation of the pivoting frame 1034 relative to base frame 1032 from being changed. In yet another approach, at least one of the friction hinges 1038 includes a gear that is configured to at least temporarily lock an orientation of the pivoting frame 1034 relative to base frame 1032.

The pivoting frame 1034 is configured to receive at least the display 1040. Moreover, in one approach, the pivoting frame 1034 is configured to receive the keyboard 1042. Accordingly, the pivoting frame 1034 may be utilized in the deployed position, and thereby allow a user to work thereon and while facing the storage interior 1046 of the server rack 1020. It should be noted that with the pivoting frame 1034 in the deployed position, the base frame 1032 of the retractable terminal 1028 is allowed to retract back through the aperture 1026 in the direction 1030 toward a partially retracted position, e.g., see the base frame 1032 in the extended position in FIG. 10C and in a partially retracted position in FIG. 10D.

In the partially retracted position, the retractable terminal 1028 is accessible for a user to utilize/work on, yet also establishes a spatially compact server rack 1020 within an environment that the server rack 1020 is located in. For example, assume that the server rack 1020 is located in a server room with isles of other similar server racks. Because the plurality of server racks within the server room may include a condensed workspace with aisles/rows of server racks interspersed with user walkways therebetween, work environments may be crowded. In the partially retracted position, e.g., see FIG. 10D, the retractable terminal 1028 does not hang out in the aforementioned shared user walkways. However, the user remains able to access input devices of the retractable terminal 1028, and access any of the servers or other network hardware housed in the interior 1024 of the server rack 1020 behind the pivoting frame 1034. For example, with continued reference to FIG. 10D, in the partially retracted position a user may utilize, e.g., work on, input devices of the pivoting frame 1034, and at any time access the interior 1024 of the server rack 1020, e.g., by pivoting the pivoting frame 1034 away from the storage interior 1046 of the server rack 1020.

Moreover, in the partially retracted position, airflow is not blocked from cooling network hardware housed within the server rack 1020. In one approach, the pivoting frame 1034 of the retractable terminal 1028 is buffered from contacting network hardware within the server rack 1020 and/or the frame of the server rack 1020, when the pivoting frame 1034 is in the deployed position. For example, in one specific approach, a mechanical stop, e.g., a bumper, an adjustable wedge, a dampening rod, etc., prevents the pivoting frame 1034 from being retracted closer than a predetermined distance, e.g., preferably about three inches, from network hardware housed within the server rack 1020 and/or the frame of the server rack 1020. Accordingly, airflow, e.g., generated by one or more fans (not shown), remains free to flow about the server rack 1020 despite the positioning of the retractable terminal 1028 and/or the positioning of any portions thereof, e.g., the pivoting frame 1034, the base frame 1032, the hinges 1038, etc.

In some approaches, the pivoting frame 1034 includes one or more recesses that accept one or more input devices when such input devices are not being used. For example, in one approach, one or more of the input devices are pivotally mounted to the pivoting frame 1034. Note that the keyboard 1042 is deployed in FIG. 10A and FIG. 10D, thereby exposing recess 108. In FIG. 10C, the keyboard 1042 is retracted within the recess 108.

In one approach, the keyboard 1042 is pivotally mounted, e.g., via friction hinges or any other known type of hinges, in the recess 108 of the pivoting frame 1034 in a manner that allows the keyboard 1042 to be folded out for use in a generally horizontal orientation (as shown in FIG. 10A and FIG. 10D), or any other angular orientation, when the retractable terminal 1028 is in the extended position or partially retracted position. Accordingly, such recesses enable the retractable terminal 1028, and particularly portions thereof, e.g., such as the pivoting frame 1034, to maintain a narrow profile, e.g., for compact storage in the interior 1024.

In some approaches, the recess 108 includes perforations therethrough, e.g., for saving material, for reducing the overall weight of the retractable terminal 1028, to allow viewing therethrough, etc.

It should be noted that a variety of different users having a variety of different physical heights may utilize the retractable terminal 1028 of the server rack 1020. As will now be described, various components of the server rack 1020 may be configured to adapt to users of any physical height for working thereon.

In one approach, the orientation of the display 1040 is selectively positionable in a recess of the pivoting frame 1034. For example, the display 1040 may be, e.g., angled downward, angled upward, angled to one side, etc. in the recess of the pivoting frame 1034 for adjusting the viewing angle of the display relative to the current user. According to various approaches, the display 1040 may be selectively positionable using, e.g., a ball joint, an adjustable arm, an adjustable stand, etc., that is coupled to the display 1040 and the pivoting frame 1034. The orientation of the display 1040 being selectively positionable also allows a user to mitigate reflection on the display 1040 which might otherwise disrupt a user's focus and/or view. Accordingly, a user that is relatively shorter may tilt the display 1040 downward, while a relatively taller user may tilt the display 1040 upward.

Moreover, in another approach, the retractable terminal 1028 is vertically positionable between upper and lower extents, e.g., along vertical direction 1048. The upper and lower extents are generally defined as the uppermost and lowermost positions allowed by the hardware that enables the vertical movement.

In one approach, the hardware that enables the vertical movement of the retractable terminal 1028 includes a rail coupled to the retractable terminal 1028. In such an approach, the retractable terminal 1028 may include a friction or other type of coupling that selectively secures the vertical position of the rail.

According to another approach, the hardware that enables the vertical movement of the retractable terminal 1028 includes a ratchet and/or cable coupled to the retractable terminal 1028.

In another approach, only the pivoting frame 1034 may be vertically positionable between the upper and lower extents.

In preferred approaches, the vertical positioning of the pivoting frame 1034 and/or the retractable terminal 1028, is configured to enable positioning of the display 1040 at about eye-level of a user when the user is facing the display 1040. Accordingly, a range of the upper and lower extents may consider users of different heights. For example, in various approaches, the lower extent of the vertical positioning of the pivoting frame 1034 and/or the retractable terminal 1028 positions the display 1040 at about eye-level of a user that is sitting, e.g., on a chair, on the ground, on a step stool, etc. Moreover, the upper extent of the vertical positioning of the pivoting frame 1034 and/or the retractable terminal 1028 positions the display 1040 at about eye-level of a user that is, e.g., standing, positioned on a step stool, crouched over, etc. Accordingly, the ability to change the vertical position of the pivoting frame 1034 and/or the retractable terminal 1028 prevents a user from having to turn, stand, or work in an uncomfortable or unnatural position when using the retractable terminal 1028.

In more specific approaches, a range of the lower extent to the upper extent of the pivoting frame 1034 and/or the retractable terminal 1028 positions a center of the display 1040 between about 39-77 inches from a surface on which the server rack 1020 rests, e.g., the ground. In other approaches, a range of the lower extent to the upper extent of the pivoting frame 1034 and/or the retractable terminal 1028 positions a typing surface of the keyboard 1042 of the display 1040 between about 29-54 inches from a surface on which the server rack 1020 rests, e.g., the ground.

In some approaches, hardware that enables the vertical movement of the pivoting frame 1034 includes similar hardware to that previously mentioned elsewhere herein for enabling the vertical movement of the retractable terminal 1028, e.g., in the direction 1030.

The hardware that enables the vertical movement of the retractable terminal 1028 and/or the pivoting frame 1034, may preferably be configured to allow adjusting of the vertical position of such component(s) via forces that a user may apply to the handle 110. For example, the vertical position of the retractable terminal 1028 is adjustable, e.g., in response to a user pulling up on the handle 110, in response to a user applying a downward force on the handle 110, in response to a user applying a rotational force to the handle 110, in response to a user engaging a trigger and/or latch on the handle 110 (not shown), etc.

In some approaches, the hardware that enables the vertical movement of the pivoting frame 1034 includes the hinges 1038, or a portion thereof. For example, in one approach, pins of one or both of the hinges 1038 are configured to enable the vertical movement of the pivoting frame 1034 between the upper and lower extents.

Figure 10G:
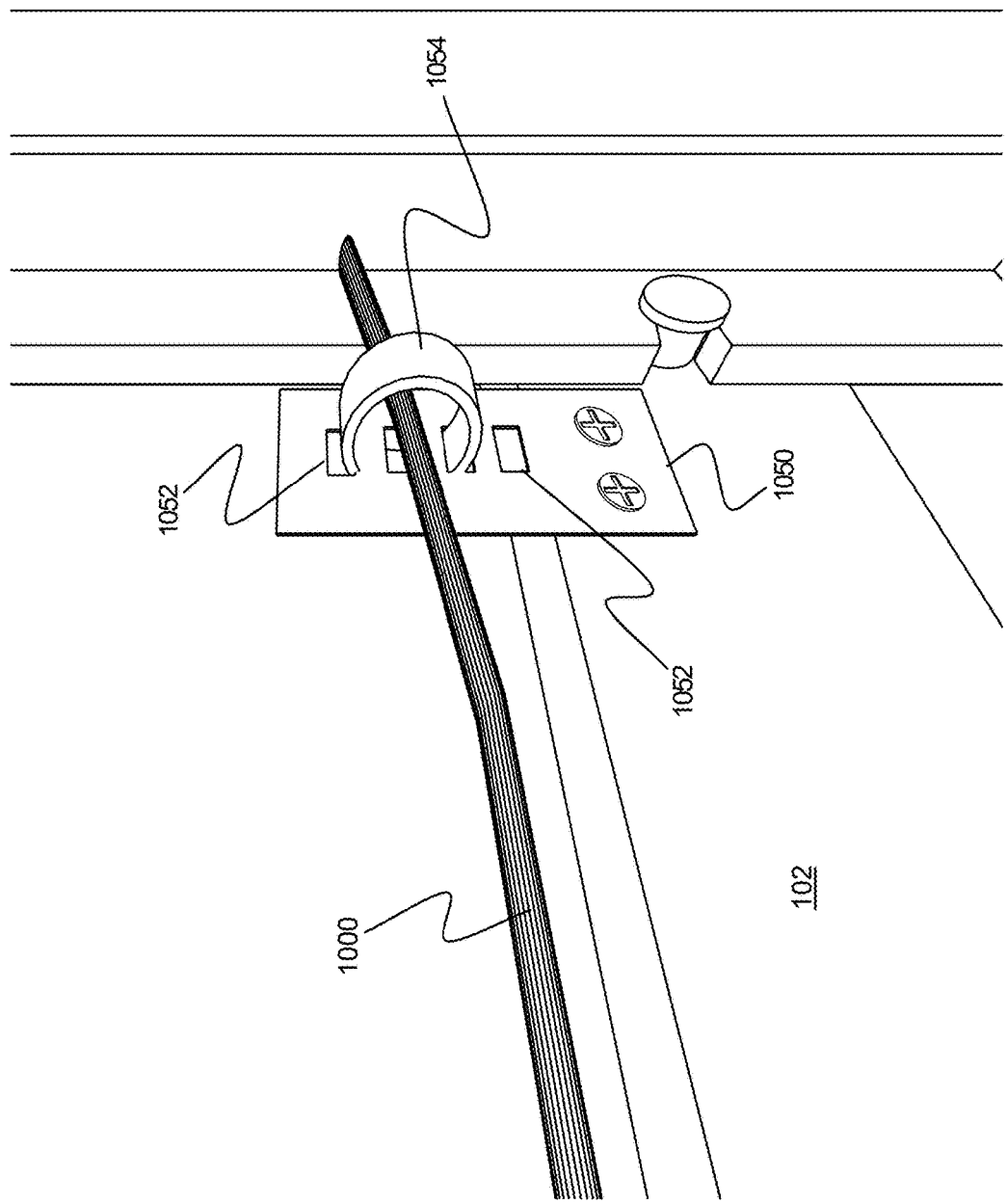
FIG. 10G is a partial perspective view of the portion of the interior of FIG. 10F.

FIGS. 10F-10G are partial perspective views of a portion of the interior 1024 of the server rack 1020. Specifically, in FIGS. 10F-10G the retractable terminal 1028 is in the extended position, and therefore is not in view within the interior 1024. Moreover, the sidewall 1022 of the server rack 1020 is omitted from view in FIGS. 10F-10G for viewing purposes.

As illustrated in both FIGS. 10F and 10G, the cable loop 1000 extends from the retractable terminal 1028 at a location that is closer to an upper sliding rail 104 of the retractable terminal 1028 than a lower sliding rail 104 of the retractable terminal 1028.

Moreover, the cable loop 1000 is anchored to a cable bracket 1050. In one approach, the cable bracket 1050 is secured to the fixed rail 102 using screws, e.g., see FIG. 11G. Of course, the cable bracket 1050 is configured to be secured to the fixed rail 102 using any type of known coupling type, e.g., rivets, adhesives, welds, etc. In one approach, the cable bracket 1050 and the fixed rail 102 are formed and/or manufactured in a unitary manner, such that they are components of a single contiguous piece of metal or plastic.

The cable bracket 1050 is shown to include a plurality of slots 1052. In one approach, a cable fastener 1054 is laced through the slots 1052 and around the cable loop 1000 for physical securing the cable loop 1000. According to various approaches, the cable fastener 1054 includes any one or more fasteners suitable for physically securing the cable loop 1000. For example, as an option, the cable fastener 1054 includes a hook-and-loop strap, a cable tie, string, cord, etc.

It some approaches, the cable loop 1000 extends along the retractable terminal 1028, e.g., using one or more cable fasteners 1054, to reach and connect with one or more input devices of the pivoting frame 1034.

Figure 11A:
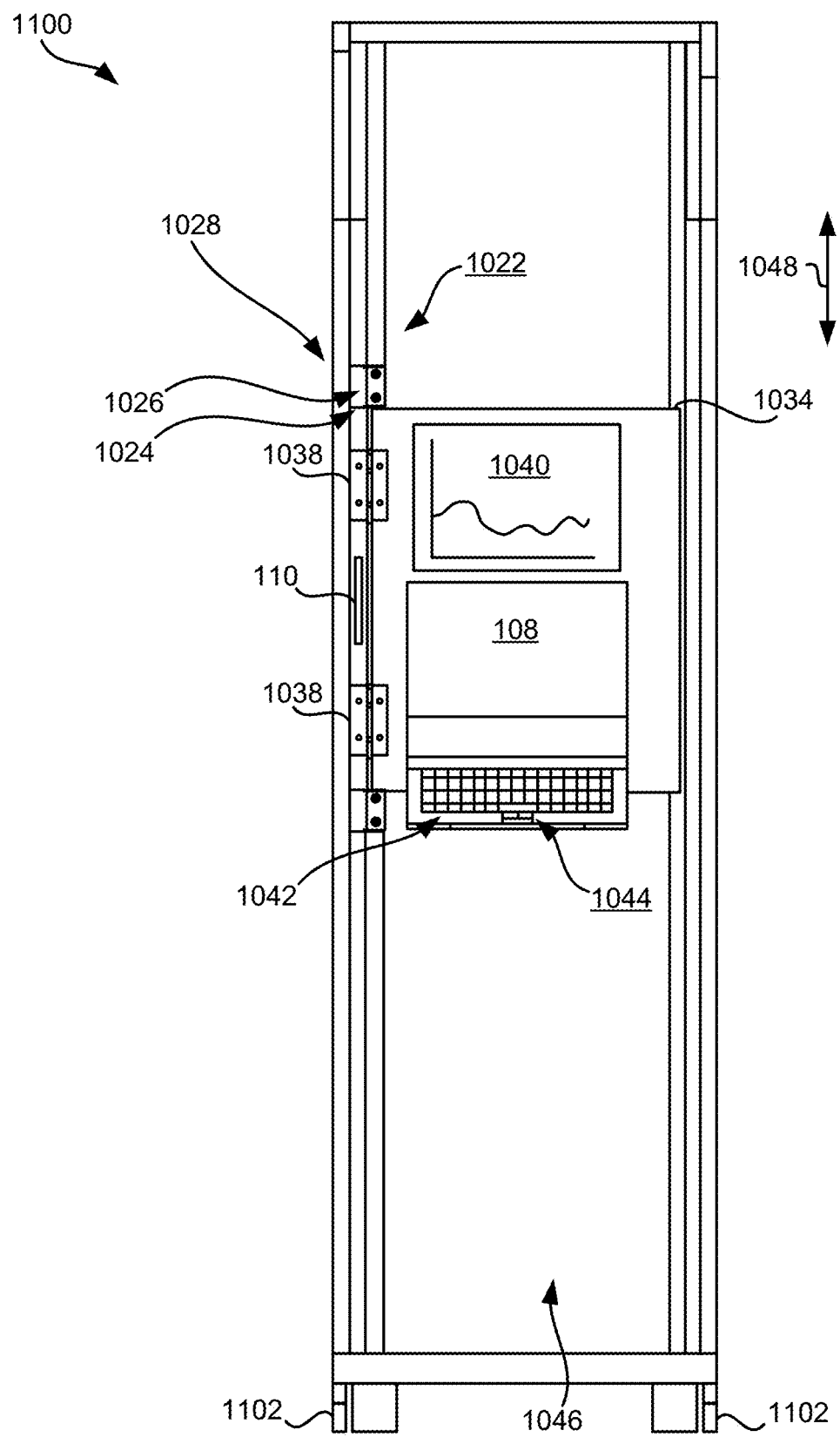
FIG. 11A is a partial perspective view of a server rack having a retractable terminal in an extended position and a pivoting frame in a deployed position, according to one embodiment.
Figure 11B:
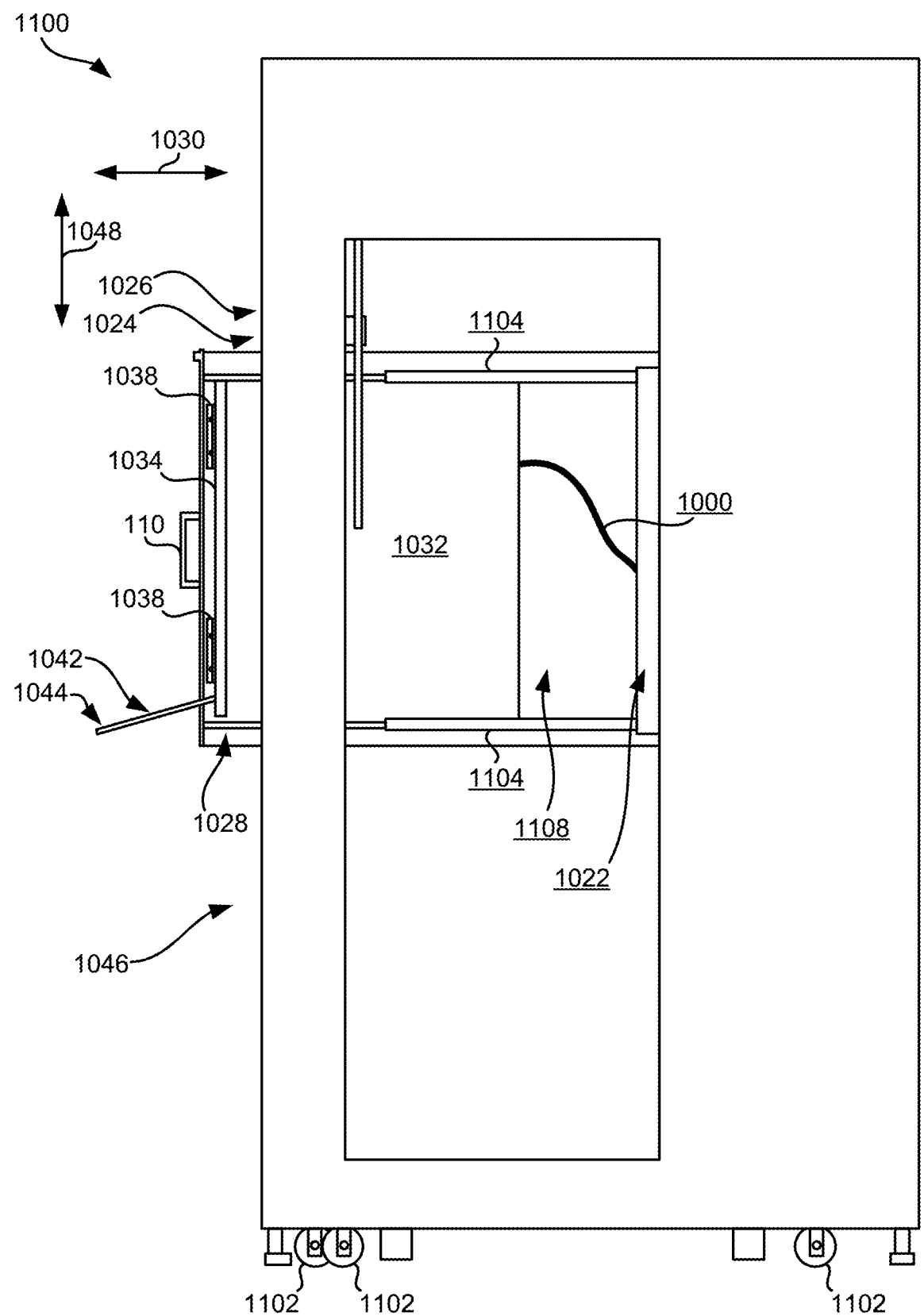
FIG. 11B is a partial perspective view of the server rack of FIG. 11A.

FIGS. 11A-11B depict a server rack 1100, in accordance with one embodiment. As an option, the server rack 1100 may be implemented in conjunction with features from any other embodiment listed herein, such as those described with reference to the other FIGS. Of course, however, such server rack 1100 and others presented herein may be used in various applications and/or in permutations which may or may not be specifically described in the illustrative embodiments listed herein. Further, the server rack 1100 presented herein may be used in any desired environment.

Various components of the server rack 1100 share common numberings with similar components of various other embodiments and/or approaches elsewhere herein.

The server rack 1100 includes a sidewall 1022 defining an interior 1024, and an aperture 1026 in the sidewall 1022. In some approaches, the sidewall 1022 includes at least one cutout, e.g., see cutout 1108 FIG. 11B.

Moreover, the server rack 1100 includes a retractable terminal 1028 that is horizontally positionable between a retracted position and an extended position (note that the retractable terminal 1028 is positioned in a partially retracted position in FIGS. 11A-11B).

The retractable terminal 1028 includes a base frame 1032 and a pivoting frame 1034 pivotally coupled to the base frame 1032, e.g., via hinges 1038.

The server rack 1100 includes wheels 1102, for selectively moving the location of the server rack 1100.

Referring now to FIG. 11B, according to various approaches, the retractable terminal 1028 is horizontally positionable between a retracted position and an extended position via one or more slide rails 1104, e.g., a linear bearing supported slide rail, a track rail, a telescoping slide rail assembly, etc.

FIG. 12 depicts a server rack 1200 with a door, in accordance with one embodiment. As an option, the server rack 1200 may be implemented in conjunction with features from any other embodiment listed herein, such as those described with reference to the other FIGS. Of course, however, such server rack 1200 and others presented herein may be used in various applications and/or in permutations which may or may not be specifically described in the illustrative embodiments listed herein. Further, the server rack 1200 presented herein may be used in any desired environment.

Various components of the server rack 1200 share common numberings with similar components of various other embodiments and/or approaches elsewhere herein.

The server rack 1200 includes a sidewall 1022 defining an interior 1024, and an aperture 1026 in the sidewall 1022.

Moreover, the server rack 1200 includes a retractable terminal 1028 that is horizontally positionable between a retracted position and an extended position (note that the retractable terminal 1028 is positioned in the extended position).

In some approaches, the retractable terminal 1028 is vertically positionable, e.g., see vertical direction 1048, between upper and lower extents when in the extended position. Note that the retractable terminal 1028 of the server rack 1200 is somewhat different that the retractable terminal 1028 of various other server racks described elsewhere herein, e.g., the retractable terminal 1028 of server rack 1020, in that the retractable terminal 1028 of the server rack 1200 does not include a pivoting frame.

The server rack 1200 further includes a door 1204 with a lock, e.g., for locking the door 1204 shut when the retractable terminal 1028 is stowed in the retracted position.

Still yet, in some approaches, when the retractable terminal 1028 is in the extended position, the retractable terminal 1028 is configured to articulate in an arc generally parallel to the ground along hinges 1202. Articulation of the retractable terminal 1028 via the hinges 1202 facilitates access to computer and network hardware 1206 within the server rack 1200. For example, by rotating the retractable terminal 1028 toward the door 1204, input devices and other elements of the retractable terminal 1028 are allowed to be moved away from a front face of the server rack 1200, thereby providing improved access to the contents within the server rack 1200.

It will be clear that the various features of the foregoing systems and/or methodologies may be combined in any way, creating a plurality of combinations from the descriptions presented above.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:
1. A server rack, comprising:
a sidewall defining an interior;
an aperture in the sidewall; and
a retractable terminal horizontally positionable between a retracted position and an extended position, the retractable terminal being positioned in the interior when in the retracted position, the retractable terminal being configured to extend through the aperture of the sidewall when transitioning from the retracted position to the extended position,
wherein the retractable terminal includes a base frame and a pivoting frame pivotally coupled to the base frame, the pivoting frame being configured to receive at least a display, the pivoting frame being positionable between an undeployed position and a deployed position relative to the base frame when the retractable terminal is in the extended position, the pivoting frame being about parallel to the base frame when in the undeployed position, the pivoting frame being oriented at least 30 degrees from the base frame when in the deployed position.

2. The server rack as recited in claim 1, wherein the retractable terminal includes an input device.

3. The server rack as recited in claim 2, wherein the input device includes at least one of a keyboard and a mouse.

4. The server rack as recited in claim 1, wherein the pivoting frame is positionable between the undeployed position and the deployed position via a friction hinge.

5. The server rack as recited in claim 1, wherein the retractable terminal includes the display.

6. The server rack as recited in claim 5, wherein the display is pivotally coupled to the retractable terminal.

7. The server rack as recited in claim 1, wherein the retractable terminal includes a tablet computer.

8. The server rack as recited in claim 1, wherein the retractable terminal includes a handle.

9. The server rack as recited in claim 1, wherein the retractable terminal is vertically positionable between upper and lower extents.

10. A server rack, comprising:
a sidewall defining an interior;
an aperture in the sidewall; and
a retractable terminal slidably positionable along a horizontal line between a retracted position and an extended position, the retractable terminal being positioned in the interior when in the retracted position, the retractable terminal being configured to extend through the aperture of the sidewall when transitioning from the retracted position to the extended position,
wherein the retractable terminal is slidably positionable along a vertical line between upper and lower extents when in the extended position.

11. The server rack as recited in claim 10, wherein the retractable terminal includes an input device.

12. The server rack as recited in claim 11, wherein the input device includes at least one of a keyboard and a mouse.

13. The server rack as recited in claim 10, wherein the retractable terminal includes a base frame and a pivoting frame pivotally coupled to the base frame.

14. The server rack as recited in claim 13, wherein the pivoting frame is configured to receive at least a display.

15. The server rack as recited in claim 13, wherein the pivoting frame is positionable between an undeployed position and a deployed position relative to the base frame when the retractable terminal is in the extended position, the pivoting frame being about parallel to the base frame when in the undeployed position, the pivoting frame being oriented at least 30 degrees from the base frame when in the deployed position.

16. The server rack as recited in claim 15, wherein the pivoting frame is positionable between the undeployed position and the deployed position via a friction hinge.

17. The server rack as recited in claim 10, wherein the retractable terminal includes a display.

18. The server rack as recited in claim 10, wherein the retractable terminal includes a tablet computer.

19. The server rack as recited in claim 10, wherein the retractable terminal includes a handle.

\* \* \* \* \*